United States Patent
Chainer et al.

(10) Patent No.: US 8,649,177 B2
(45) Date of Patent: *Feb. 11, 2014

(54) METHOD OF FABRICATING A COOLED ELECTRONIC SYSTEM

(75) Inventors: Timothy J. Chainer, Putnam Valley, NY (US); Michael A. Gaynes, Vestal, NY (US); David P. Graybill, Staatsburg, NY (US); Madhusudan K. Iyengar, Woodstock, NY (US); Vinod Kamath, Raleigh, NC (US); Bejoy J. Kochuparambil, Apex, NC (US); Roger R. Schmidt, Poughkeepsie, NY (US); Mark D. Schultz, Ossining, NY (US); Daniel P. Simco, Pound Ridge, NY (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/451,714

(22) Filed: Apr. 20, 2012

(65) Prior Publication Data
US 2012/0279047 A1 Nov. 8, 2012

Related U.S. Application Data

(63) Continuation of application No. 13/102,211, filed on May 6, 2011.

(51) Int. Cl.
*H05K 7/20* (2006.01)
(52) U.S. Cl.
USPC ............... 361/700; 361/679.53; 361/679.58; 361/688; 361/699; 361/711

(58) Field of Classification Search
USPC ................. 361/699, 679.54, 679.58, 720
See application file for complete search history.

(56) References Cited

U.S. PATENT DOCUMENTS

| | | | |
|---|---|---|---|
| 5,168,921 A | 12/1992 | Meyer | |
| 5,414,591 A | 5/1995 | Kumura et al. | |

(Continued)

FOREIGN PATENT DOCUMENTS

| | | |
|---|---|---|
| CN | 201222836 Y | 4/2009 |
| JP | 01077199 A | 3/1989 |

(Continued)

OTHER PUBLICATIONS

IBM Technical Disclosure, "Highly-Efficient Copper Rail Design for Optimized Cooling of DRAM Modules", IPCOM000184053D (Jun. 9, 2009).

(Continued)

*Primary Examiner* — Adrian S Wilson
*Assistant Examiner* — Abhishek Rathod
(74) *Attorney, Agent, or Firm* — Dennis Jung, Esq.; Kevin P. Radigan, Esq.; Heslin Rothenberg Farley & Mesiti P.C.

(57) ABSTRACT

A method of fabricating a liquid-cooled electronic system is provided which includes an electronic assembly having an electronics card and a socket with a latch at one end. The latch facilitates securing of the card within the socket. The method includes providing a liquid-cooled cold rail at the one end of the socket, and a thermal spreader to couple the electronics card to the cold rail. The thermal spreader includes first and second thermal transfer plates coupled to first and second surfaces on opposite sides of the card, and thermally conductive extensions extending from end edges of the plates, which couple the respective transfer plates to the liquid-cooled cold rail. The extensions are disposed to the sides of the latch, and the card is securable within or removable from the socket using the latch without removing the cold rail or the thermal spreader.

11 Claims, 21 Drawing Sheets

(56) References Cited

U.S. PATENT DOCUMENTS

| | | | |
|---|---|---|---|
| 5,794,454 A | 8/1998 | Harris et al. | |
| 6,263,959 B1 | 7/2001 | Ikeda et al. | |
| 6,411,512 B1 | 6/2002 | Mankaruse et al. | |
| 6,434,000 B1 | 8/2002 | Pandolfi et al. | |
| 6,480,014 B1 | 11/2002 | Li et al. | |
| 6,548,894 B2 | 4/2003 | Chu et al. | |
| 6,557,354 B1 | 5/2003 | Chu et al. | |
| 6,775,137 B2 | 8/2004 | Chu et al. | |
| 6,934,118 B2 | 8/2005 | Hidaka et al. | |
| 7,002,799 B2 | 2/2006 | Malone et al. | |
| 7,151,668 B1 | 12/2006 | Stathakis | |
| 7,221,569 B2 * | 5/2007 | Tsai | 361/704 |
| 7,233,501 B1 | 6/2007 | Ingalz | |
| 7,273,090 B2 | 9/2007 | Crocker et al. | |
| 7,286,355 B2 | 10/2007 | Cheon | |
| 7,365,985 B1 * | 4/2008 | Ni | 361/715 |
| 7,388,749 B1 | 6/2008 | Feroli et al. | |
| 7,395,851 B2 | 7/2008 | Lee et al. | |
| 7,436,663 B2 | 10/2008 | Matsushima et al. | |
| 7,440,278 B2 | 10/2008 | Cheng | |
| 7,443,672 B2 | 10/2008 | Peng et al. | |
| 7,573,714 B2 | 8/2009 | Ali | |
| 7,595,550 B2 | 9/2009 | Cady et al. | |
| 7,626,820 B1 | 12/2009 | Konshak et al. | |
| 7,684,196 B2 | 3/2010 | Eckberg et al. | |
| 7,703,291 B2 | 4/2010 | Bushnik et al. | |
| 7,746,642 B2 | 6/2010 | Lai et al. | |
| 7,791,881 B2 | 9/2010 | Chou et al. | |
| 7,796,393 B2 | 9/2010 | Lengen et al. | |
| 7,796,399 B2 | 9/2010 | Clayton et al. | |
| 7,817,412 B2 | 10/2010 | Sullivan | |
| 7,969,736 B1 * | 6/2011 | Iyengar et al. | 361/699 |
| 8,027,162 B2 * | 9/2011 | Campbell et al. | 361/699 |
| 8,274,787 B2 | 9/2012 | Alyaser et al. | |
| 2001/0000880 A1 | 5/2001 | Chu et al. | |
| 2004/0250989 A1 * | 12/2004 | Im et al. | 165/80.1 |
| 2005/0068728 A1 | 3/2005 | Chu et al. | |
| 2006/0146497 A1 | 7/2006 | Gauche et al. | |
| 2006/0221578 A1 * | 10/2006 | Foster et al. | 361/721 |
| 2006/0250772 A1 | 11/2006 | Salmonson et al. | |
| 2007/0034356 A1 | 2/2007 | Kenny et al. | |
| 2007/0263356 A1 | 11/2007 | Weber et al. | |
| 2007/0263359 A1 * | 11/2007 | Lai et al. | 361/715 |
| 2008/0060791 A1 | 3/2008 | Strobel et al. | |
| 2008/0101035 A1 * | 5/2008 | Chen | 361/720 |
| 2008/0112075 A1 | 5/2008 | Farquhar et al. | |
| 2008/0155990 A1 | 7/2008 | Gupta et al. | |
| 2008/0239564 A1 | 10/2008 | Farquhar et al. | |
| 2008/0259566 A1 | 10/2008 | Fried | |
| 2008/0259567 A1 | 10/2008 | Campbell et al. | |
| 2008/0310105 A1 | 12/2008 | Cheng | |
| 2009/0002951 A1 * | 1/2009 | Legen et al. | 361/715 |
| 2009/0080151 A1 * | 3/2009 | Kalms et al. | 361/679.52 |
| 2009/0120607 A1 | 5/2009 | Cheon et al. | |
| 2009/0190304 A1 * | 7/2009 | Meyer et al. | 361/679.47 |
| 2009/0219687 A1 | 9/2009 | Lin | |
| 2009/0277616 A1 * | 11/2009 | Cipolla et al. | 165/104.33 |
| 2009/0284924 A1 | 11/2009 | Konshak et al. | |
| 2010/0025010 A1 * | 2/2010 | Cipolla et al. | 165/47 |
| 2010/0027220 A1 | 2/2010 | Hughes et al. | |
| 2010/0085712 A1 * | 4/2010 | Hrehor et al. | 361/699 |
| 2010/0142147 A1 | 6/2010 | Chang et al. | |
| 2010/0252234 A1 | 10/2010 | Campbell et al. | |
| 2010/0313590 A1 | 12/2010 | Campbell et al. | |
| 2011/0069454 A1 * | 3/2011 | Campbell et al. | 361/700 |
| 2012/0026670 A1 * | 2/2012 | Rau et al. | 361/679.31 |
| 2012/0279047 A1 * | 11/2012 | Chainer et al. | 29/592.1 |

FOREIGN PATENT DOCUMENTS

| | | |
|---|---|---|
| JP | 2010040886 A | 2/2010 |
| TW | 323643 U | 12/2007 |
| TW | 200937175 A | 9/2009 |

OTHER PUBLICATIONS

Office Action for U.S. Appl. No. 12/566,081 (U.S. Patent Publication No. 2011/0069454 A1), dated Jan. 14, 2011.

Notice of Allowance for U.S. Appl. No. 12/566,081 (U.S. Patent Publication No. 2011/0069454 A1), dated May 20, 2011.

Chainer et al., Office Action for U.S. Appl. No. 13/102,211, filed May 6, 2011, dated Oct. 4, 2012.

Chainer et al., Office Action for U.S. Appl. No. 13/102,195, filed May 6, 2011 (U.S. Patent Publication No. 2012/0279233 A1), dated Jul. 17, 2013 (38 pgs.)

Chainer et al., Office Action for U.S. Appl. No. 13/102,200, filed May 6, 2011 (U.S. Patent Publication No. 2012/0279686 A1), dated Nov. 25, 2013 (48 pages).

* cited by examiner

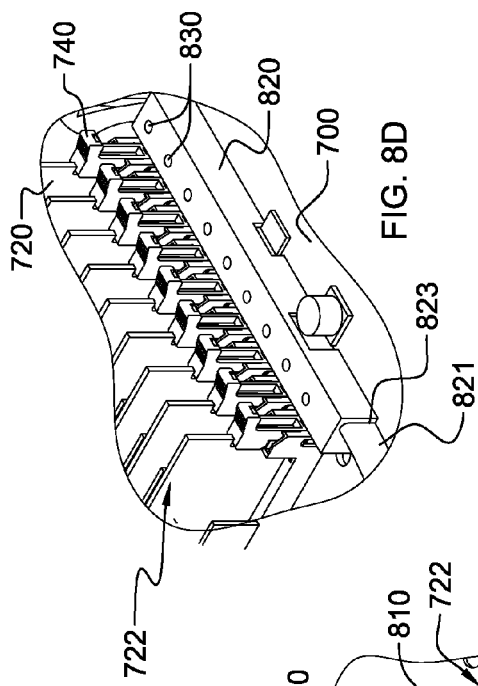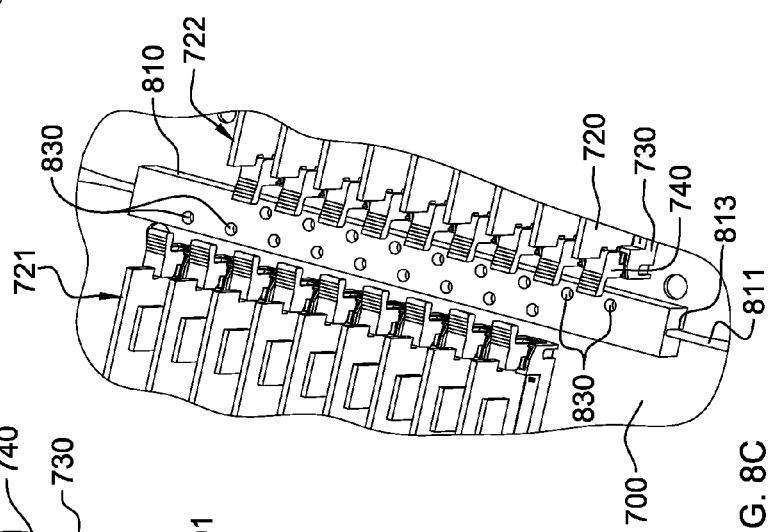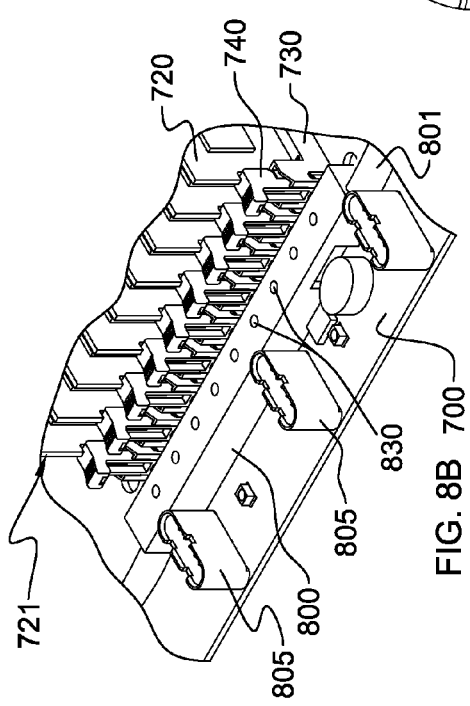

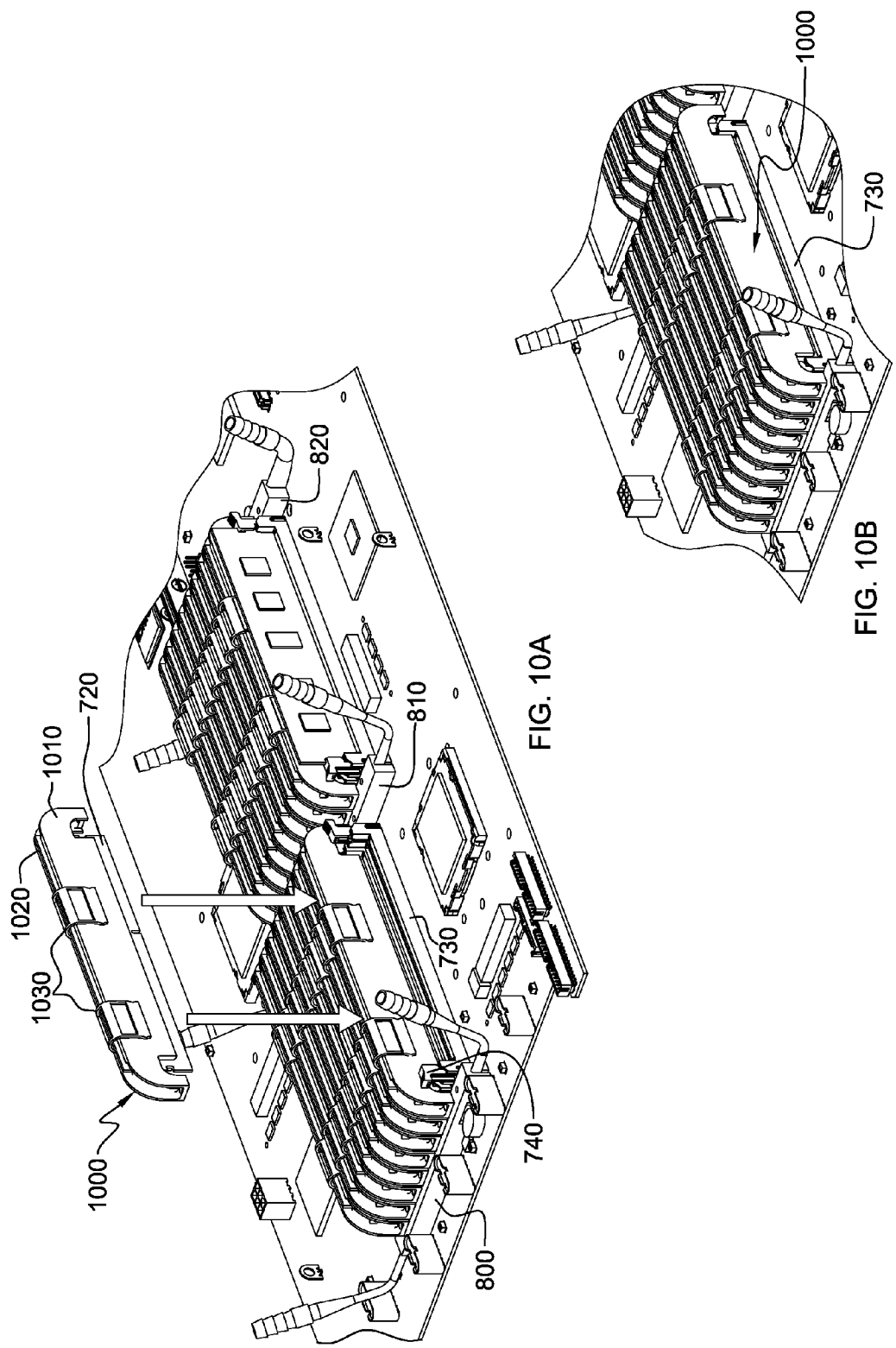

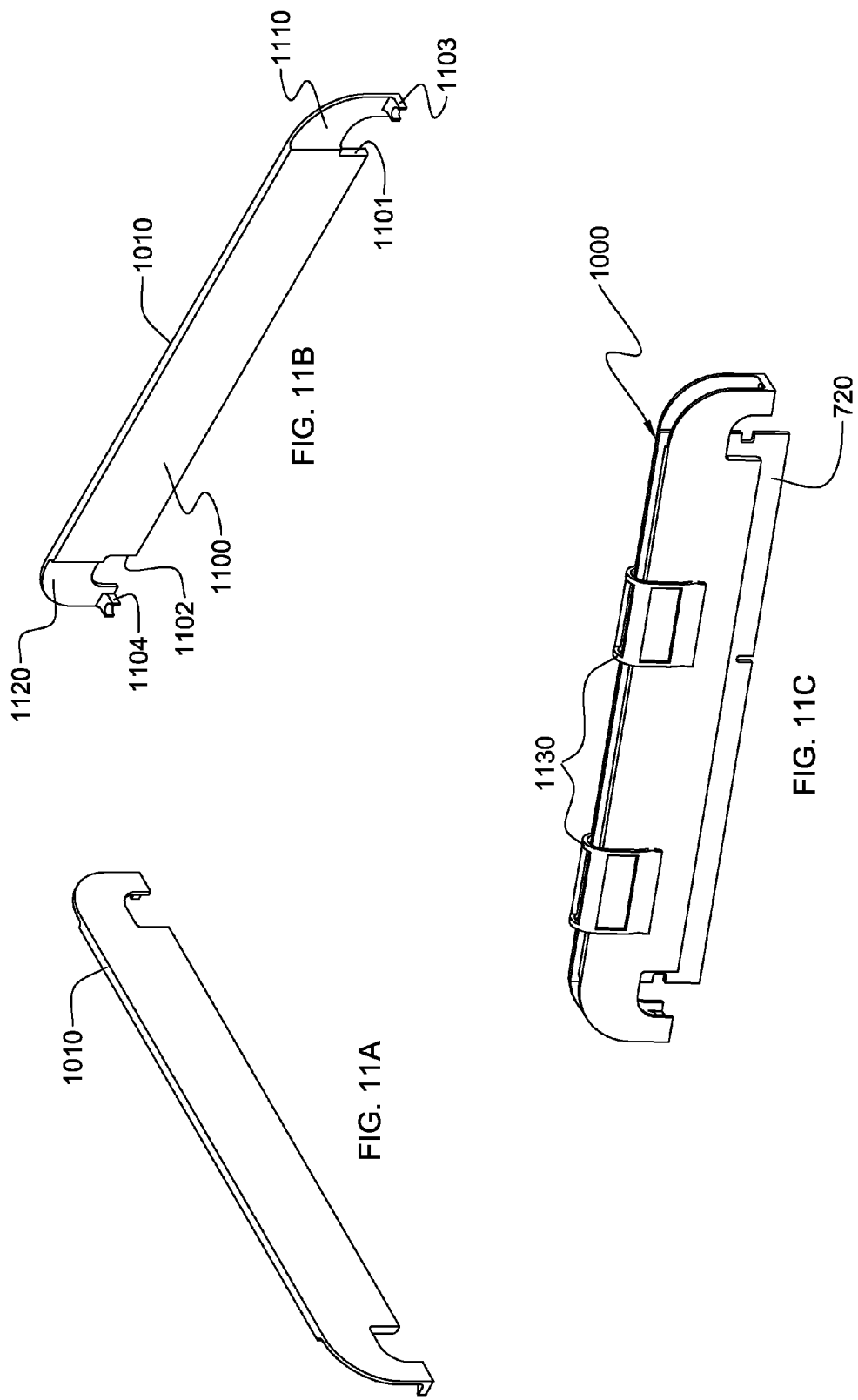

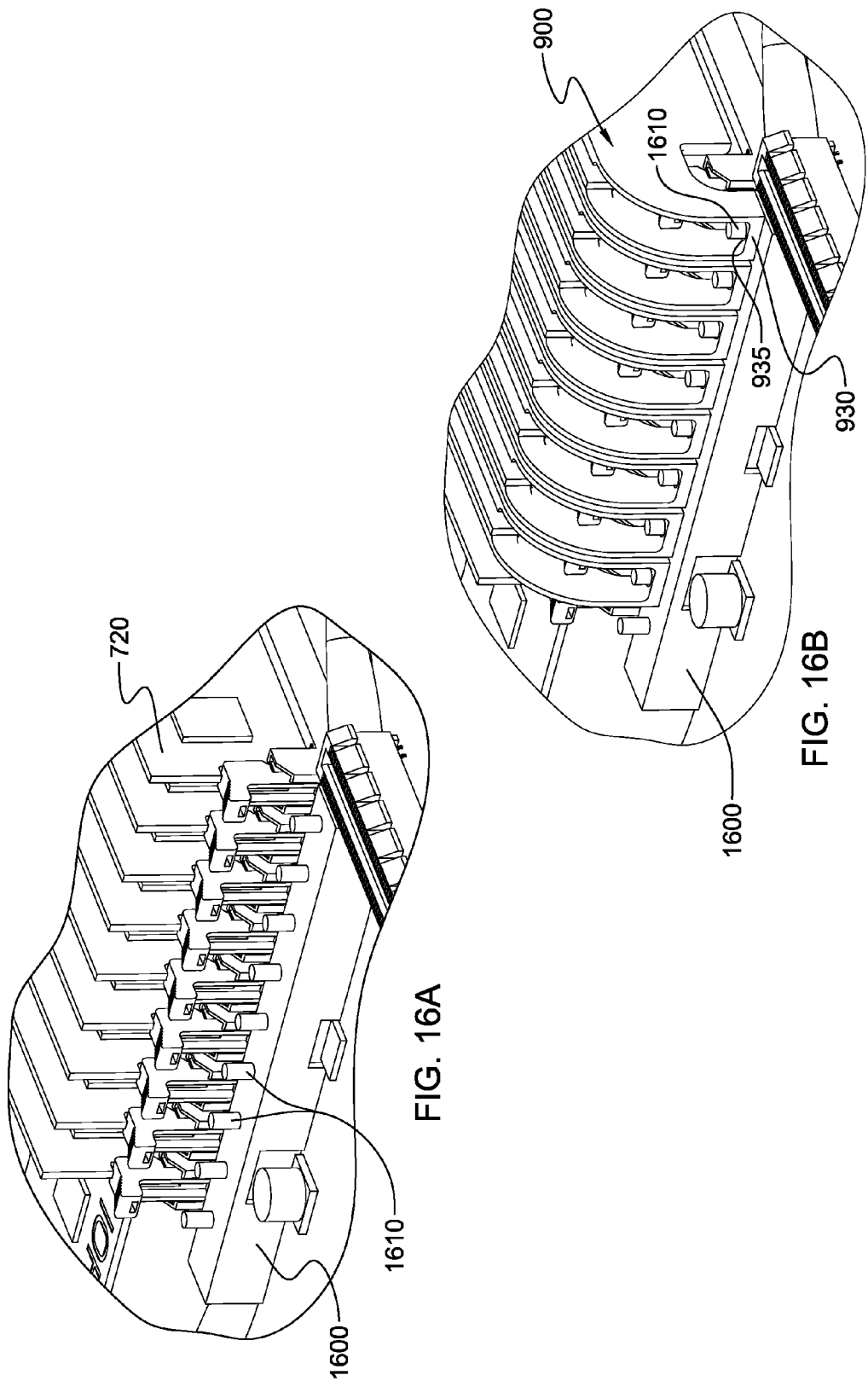

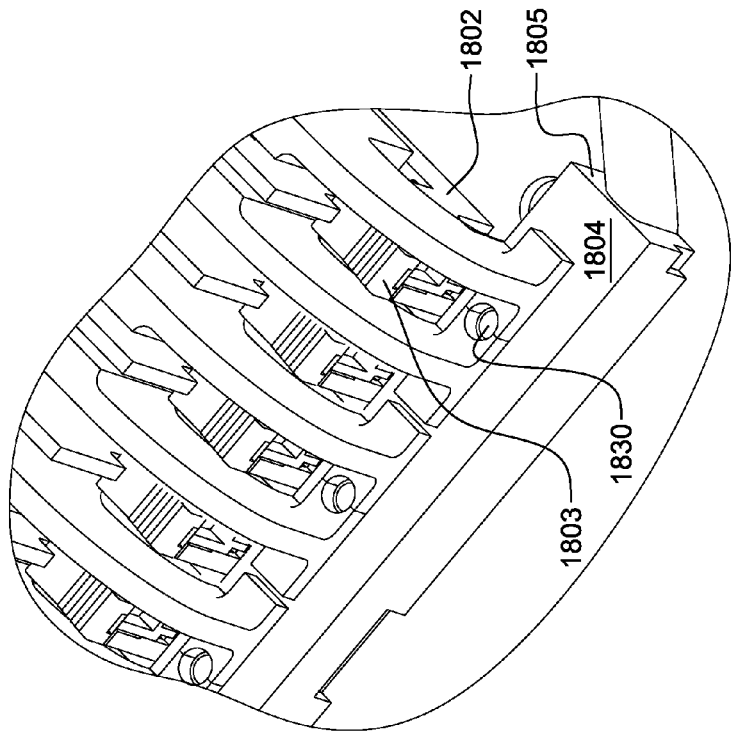
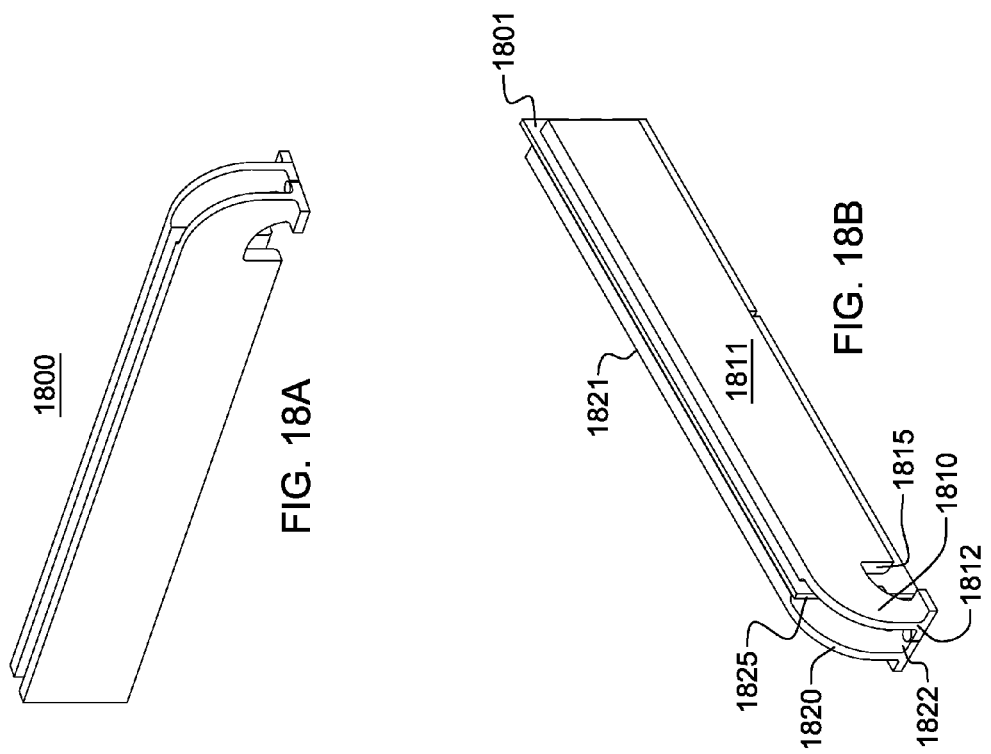
FIG. 18A
FIG. 18B
FIG. 18C

METHOD OF FABRICATING A COOLED ELECTRONIC SYSTEM

CROSS-REFERENCE TO RELATED APPLICATION

This application is a continuation of U.S. Ser. No. 13/102,211, entitled "COOLED ELECTRONIC SYSTEM WITH THERMAL SPREADERS COUPLING ELECTRONICS CARDS TO COLD RAILS," filed May 6, 2011, and which is hereby incorporated herein by reference in its entirety.

STATEMENT REGARDING FEDERALLY SPONSORED RESEARCH

This invention was made with Government support under Contract No. DE-EE0002894, awarded by the Department of Energy. Accordingly, the U.S. Government has certain rights in the invention.

BACKGROUND

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

BRIEF SUMMARY

In one aspect, a method of fabricating a cooled electronic system is provided. The method includes: providing an electronic assembly, the electronic assembly including: an electronics card comprising a first surface and a second surface on opposite sides of the electronics card, and a socket with a latch at one end of the socket, the latch facilitating latching of the electronics card within or unlatching of the electronics card from the socket; disposing a liquid-cooled structure at the one end of the socket, the liquid-cooled structure comprising a thermally conductive structure with at least one coolant-carrying channel extending within the thermally conductive structure; and providing a thermal spreader coupling the electronics card to the liquid-cooled structure. The thermal spreader includes first and second thermal transfer plates, and first and second thermally conductive extensions. The first thermal transfer plate and the second thermal transfer plate respectively include first and second thermal conduction surfaces, which are spaced in opposing relation and configured to accommodate the electronics card therebetween, with the first thermal conduction surface thermally coupled to the first surface of the electronics card, and the second thermal conduction surface thermally coupled to the second surface of the electronics card. The first thermal transfer plate and the second thermal transfer plate each includes a first end edge and a second end edge. The first thermally conductive extension extends from the first end edge of the first thermal transfer plate, and the second thermally conductive extension extends from the first end edge of the second thermal transfer plate. The first thermally conductive extension couples the first thermal transfer plate to the liquid-cooled structure, and the second thermally conductive extension couples the second thermal transfer plate to the liquid-cooled structure, wherein the first thermally conductive extension is disposed at a first side of the latch at the one end of the socket of the electronic assembly, and the second thermally conductive extension is disposed at a second side of the latch, the first side and the second side of the latch being opposite first and second sides of the latch. The latch is accessible and facilitates securing of the electronics card within the socket or removal of the electronics card from the socket without removing of at least one of the liquid-cooled structure or the thermal spreader.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8B is a partial depiction of the partially assembled cooled electronic system of FIG. 8A, and illustrating in greater detail, one embodiment of the first liquid-cooled cold rail disposed at one end of the parallel-disposed sockets that form part of the first array of electronics cards, in accordance with one or more aspects of the present invention;

FIG. 8C is a partial depiction of the second liquid-cooled cold rail disposed at the other end of the sockets comprising part of the first array of electronics cards, and shown disposed between the first and second arrays of electronics cards illustrated in FIG. 8A, in accordance with one or more aspects of the present invention;

FIG. 8D depicts one embodiment of the third liquid-cooled cold rail disposed at the other end of the sockets that form part of the second array of electronics cards illustrated in FIG. 8A, in accordance with one or more aspects of the present invention;

FIG. 10A depicts the cooled electronic system of FIGS. 7-9D, with a thermal spreader shown clipped to an electronics card being inserted into a respective socket of the first array of electronics cards, in accordance with one or more aspects of the present invention;

FIG. 10B depicts the cooled electronic system of FIG. 10A, with the illustrated electronics card and associated thermal spreader shown in latched position within the first array of electronics cards, in accordance with one or more aspects of the present invention;

FIG. 11A depicts one embodiment of a thermal transfer plate of a heat spreader, similar to the heat spreader illustrated in FIGS. 9A-9D, in accordance with one or more aspects of the present invention;

FIG. 11B depicts the thermal transfer plate of FIG. 11A, and illustrates an opposite side of the plate, the opposite side comprising a thermal conduction surface to be physically coupled to a first surface on one side of a respective electronics card, in accordance with one or more aspects of the present invention;

FIG. 11C depicts one embodiment of an assembled subassembly comprising an electronics card, a thermal spreader, and spring clips shown forcing the thermal transfer plates of the thermal spreader together and into physical contact with surfaces on opposite sides of the electronics card, in accordance with one or more aspects of the present invention;

FIG. 16A illustrates an alternate embodiment of a liquid-cooled cold rail for a cooled electronic system, in accordance with one or more aspects of the present invention;

FIG. 16B depicts the liquid-cooled cold rail of FIG. 16A, and illustrates a plurality of thermal spreaders physically coupled to the liquid-cooled cold rail, in accordance with one or more aspects of the present invention;

FIG. 18A depicts another embodiment of a thermal spreader for a cooled electronic system, in accordance with one or more aspects of the present invention;

FIG. 18B depicts the thermal spreader of FIG. 18A, shown with an electronics card disposed between the first and second thermal transfer plates of the thermal spreader, in accordance with one or more aspects of the present invention;

FIG. 18C is a partially assembled, cooled electronic system illustrating the thermal spreaders of FIGS. 18A & 18B, coupling the respective electronics cards to the illustrated liquid-cooled cold rail, in accordance with one or more aspects of the present invention;

DETAILED DESCRIPTION

Figure 1:
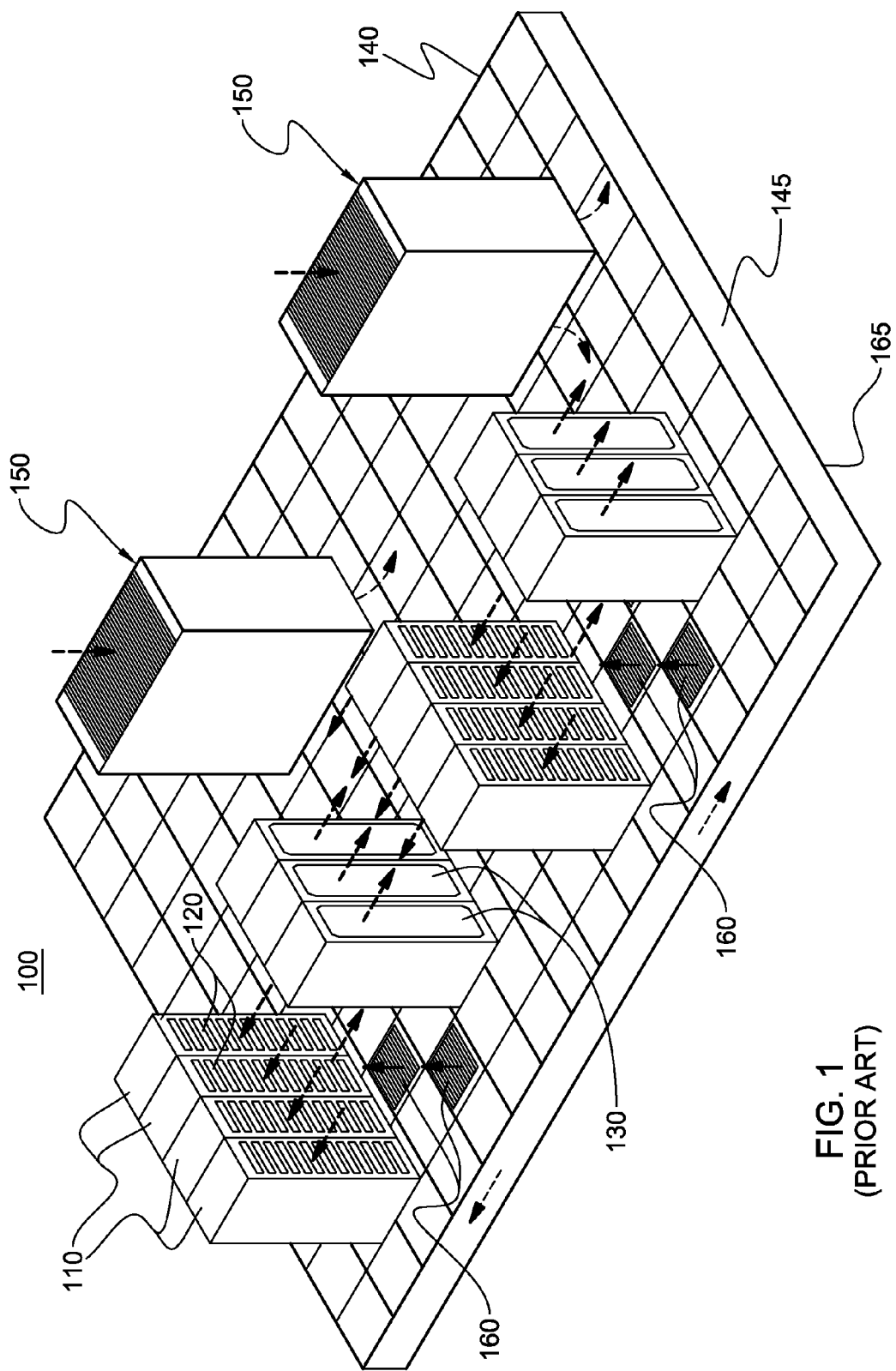
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards comprising a plurality of memory modules (such as one or more dual in-line memory modules (DIMMs)).

Further, as used herein, the terms "liquid-cooled structure", "liquid-cooled cold plate" and "liquid-cooled cold rail" refer to thermally conductive structures having one or more channels (or passageways) formed therein or passing therethrough, which facilitate the flow of liquid coolant through the structure. A liquid-cooled structure may be, for example, a liquid-cooled cold plate or a liquid-cooled cold rail. In one example, tubing is provided extending through the liquid-cooled structure. An "air-to-liquid heat exchanger" or "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger can vary without departing from the scope of the invention disclosed. Still further, "data center" refers to a computer installation containing one or more electronics racks to be cooled. As a specific example, a data center may comprise one or more rows of rack-mounted computer units, such as server units.

One example of coolant used within the cooled electronic apparatuses disclosed herein is water. However, the concepts presented are readily adapted to use with other types of coolant. For example, the coolant may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the rack unit. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise, in part, exhausted air from the "hot" aisles of the computer installation defined, for example, by opposing air outlet sides 130 of the electronics racks 110.

Figure 2:
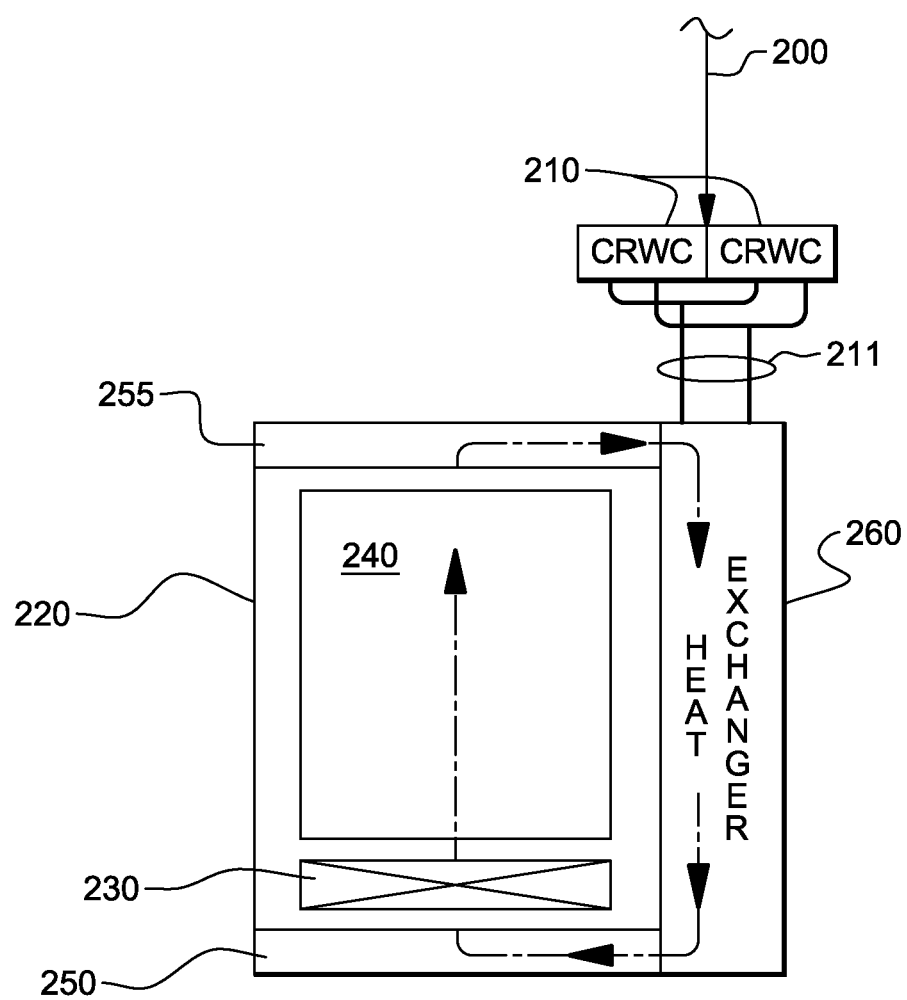
FIG. 2 is a cross-sectional plan view of one embodiment of an electronics rack with an attached air-to-liquid heat exchanger enhancing cooling of air passing through the electronics rack.
Figure 3:
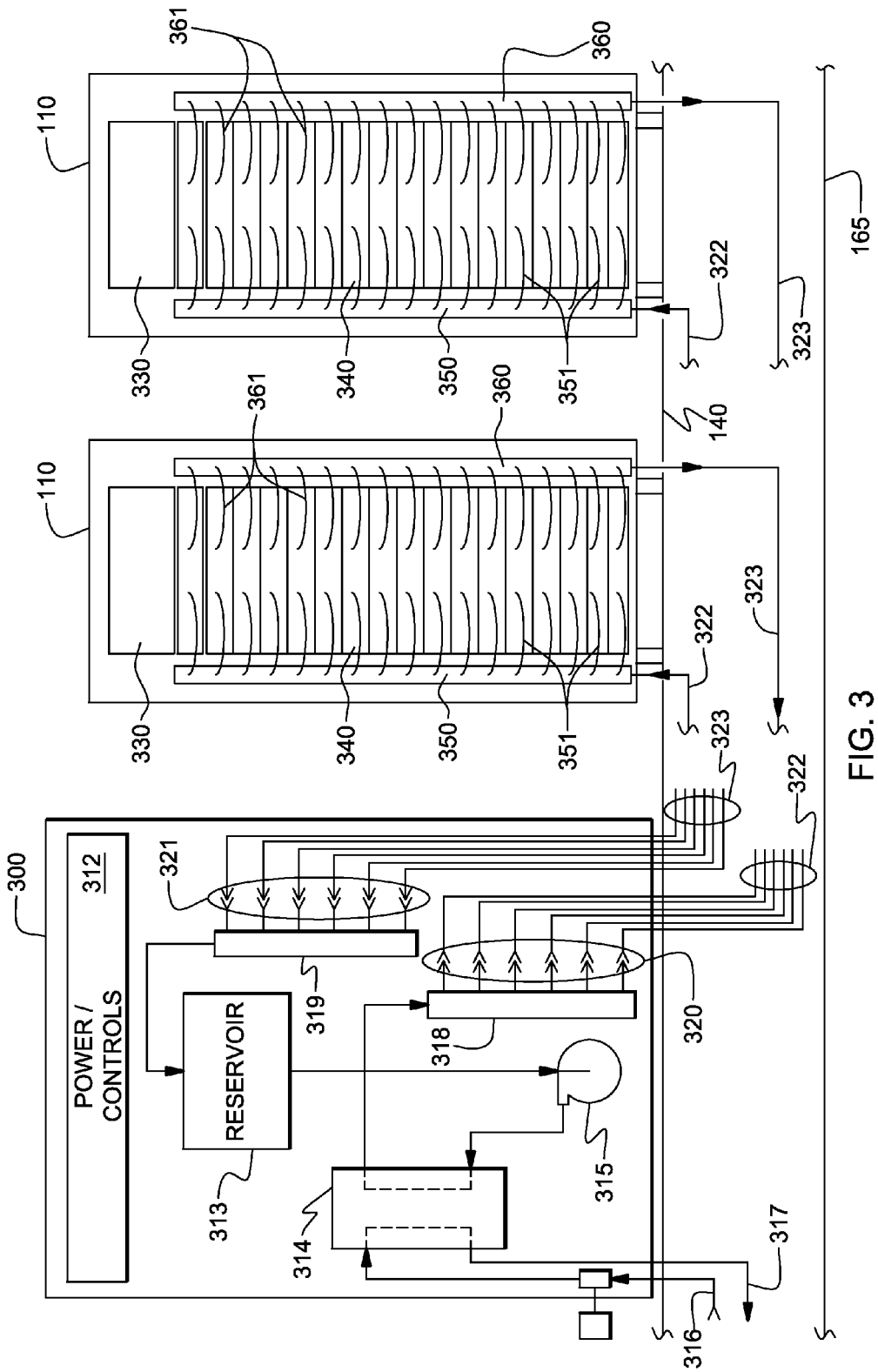
FIG. 3 depicts one embodiment of a data center with a coolant distribution unit facilitating liquid-cooling of one or more liquid-cooled electronics racks of the data center, in accordance with an aspect of the present invention.
Figure 4:
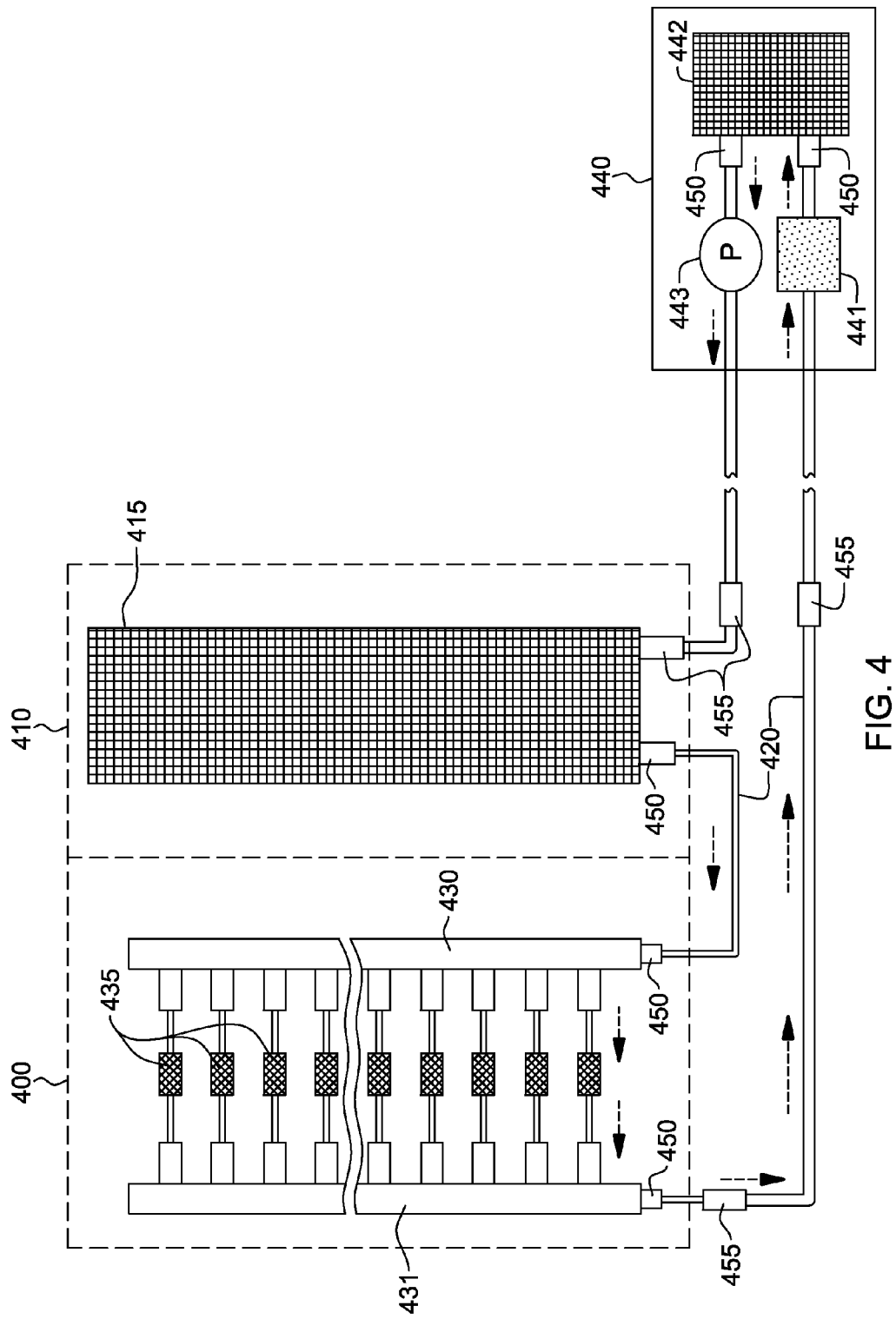
FIG. 4 depicts an alternate embodiment of a cooling apparatus and liquid-cooled electronics rack, in accordance with one or more aspects of the present invention.

Due to ever-increasing air flow requirements through electronics racks, and the limits of air distribution within a typical data center installation, liquid-based cooling is being combined with conventional air-cooling. FIGS. 2-4 illustrate various embodiments of a data center implementation employing a liquid-based cooling system.

FIG. 2 depicts one rack-level liquid-cooling solution which utilizes chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Pat. No.

6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, liquid-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to liquid-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger, for example, disposed at an air outlet side thereof, which also receives system coolant from the system coolant supply manifold 350 and returns system coolant to the system coolant return manifold 360.

FIG. 4 illustrates another embodiment of a liquid-cooled electronics rack and cooling system therefor, in accordance with one or more aspects of the present invention. In this embodiment, the electronics rack 400 has a side car structure 410 associated therewith or attached thereto, which includes an air-to-liquid heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-liquid heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-liquid heat exchanger 415.

As illustrated, coolant flowing through warm-liquid coolant loop 420, after circulating through air-to-liquid heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to a cooling unit 440 disposed (for example) outdoors from the data center. In the embodiment illustrated, cooling unit 440 includes a filter 431 for filtering the circulating liquid coolant, a condenser (or air-to-liquid heat exchanger) 442 for removing heat from the liquid coolant, and a pump 443 for returning the liquid coolant through warm-liquid coolant loop 420 to air-to-liquid heat exchanger 415, and subsequently to the liquid-cooled electronics rack 400. By way of example, hose barb fittings 450 and quick disconnect couplings 455 may be employed to facilitate assembly or disassembly of warm-liquid coolant loop 420.

In one example of the warm coolant-cooling approach of FIG. 4, ambient temperature might be 30° C., and coolant temperature 35° C. leaving the air-to-liquid heat exchanger 442 of the cooling unit. The cooled electronic system depicted thus facilitates a chiller-less data center. Advantageously, such a liquid-cooling solution provides highly energy efficient cooling of the electronic systems of the electronics rack, using liquid (e.g., water), that is cooled via circulation through the air-to-liquid heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the liquid coolant flowing through the liquid-cooled electronics rack, and associated air-to-liquid heat exchanger (if present), in a manner such as described above in connection with FIGS. 2 & 3.

Figure 5B:
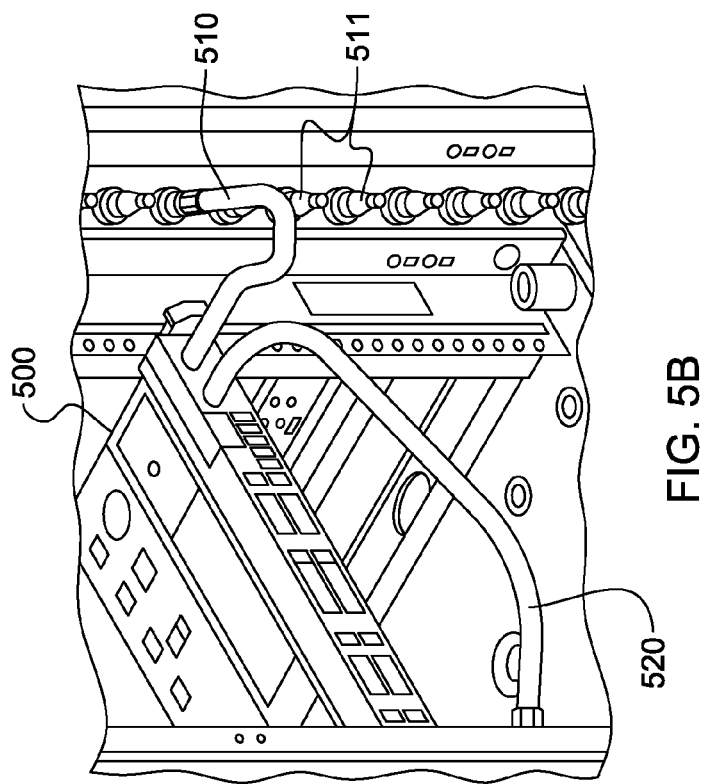
FIG. 5B is a partial depiction of a more detailed embodiment of the rack-level coolant distribution structures illustrated in FIG. 5A, in accordance with one or more aspects of the present invention.
Figure 5A:
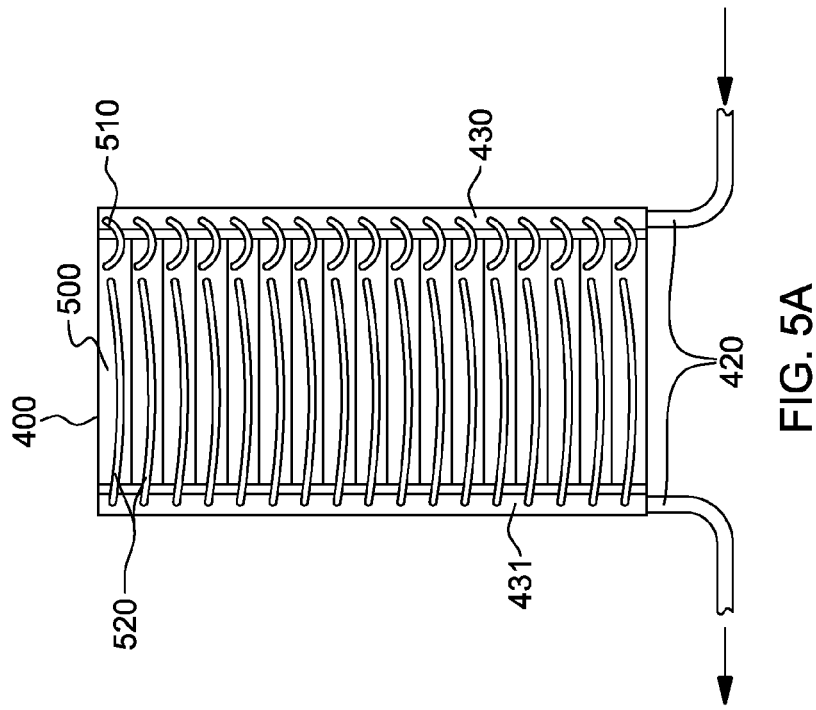
FIG. 5A is a more detailed, elevational view of one embodiment of the liquid-cooled electronics rack of FIG. 4, and illustrating rack-level coolant distribution structures, in accordance with one or more aspects of the present invention.

FIGS. 5A & 5B depict in greater detail one embodiment of a liquid-cooled electronics rack, such as depicted in FIG. 4, in accordance with one or more aspects of the present invention. In this implementation, liquid-cooled electronics rack 400 comprises a plurality of electronic systems 500, within which one or more electronic components are to be liquid-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to liquid-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be liquid-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm-liquid coolant, such as water, is supplied from the cooling unit, either directly, or through one or more air-to-liquid heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
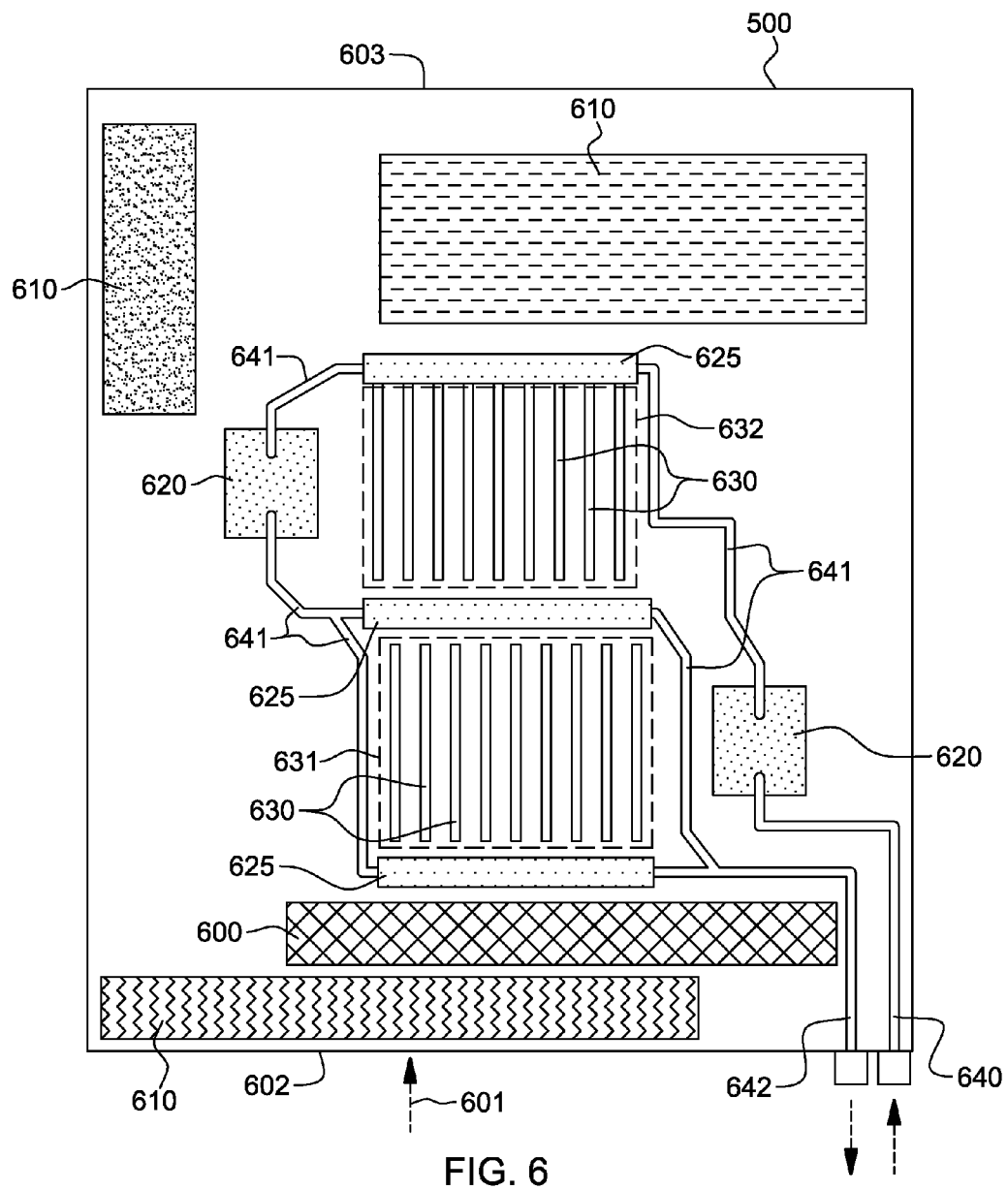
FIG. 6 is a plan view of one embodiment of an electronic system layout for a liquid-cooled electronics rack, and illustrating multiple liquid-cooled cold plates and multiple liquid-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which liquid-cooled cold plates 620 (of the liquid-based cooling apparatus) are coupled, as well as multiple arrays 631, 632 of electronics cards 630 (e.g., memory modules such as dual in-line memory modules (DIMMs)), which are to be thermally coupled to one or more liquid-cooled cold rails 625. As used herein "thermally coupled" refers to a physical thermal transport path being established between components, for example, between an electronics card and a liquid-cooled cold rail for the conduction of heat from one to the other.

The illustrated liquid-based cooling approach further includes multiple coolant-carrying tubes connecting in fluid communication liquid-cooled cold plates 620 and liquid-cooled cold rails 625. These coolant-carrying tubes comprise (for example), a coolant supply tube 640, multiple bridge tubes 641, and a coolant return tube 642. In the embodiment illustrated, bridge tubes 641 connect one liquid-cooled cold rail 625 in series between the two liquid-cooled cold plates 620, and connect in parallel two additional liquid-cooled cold rails 625 between the second liquid-cooled cold plate 620 and the coolant return tube 642. Note that this configuration is provided by way of example only. The concepts disclosed herein may be readily adapted to use with various configurations of cooled electronic system layouts. Note also, that as depicted herein, the liquid-cooled cold rails are elongate, thermally conductive structures comprising one or more channels through which liquid coolant passes, for example, via one or more tubes extending through the structures. The liquid-cooled cold rails are disposed, in the embodiment illustrated, at the ends of the two arrays (or banks) 631, 632 of electronics cards 630, and multiple thermal spreaders are provided coupling in thermal communication electronics cards 630 and liquid-cooled cold rails 625. Various such thermal spreaders are discussed below with reference to FIGS. 8A-19C.

Figure 7:
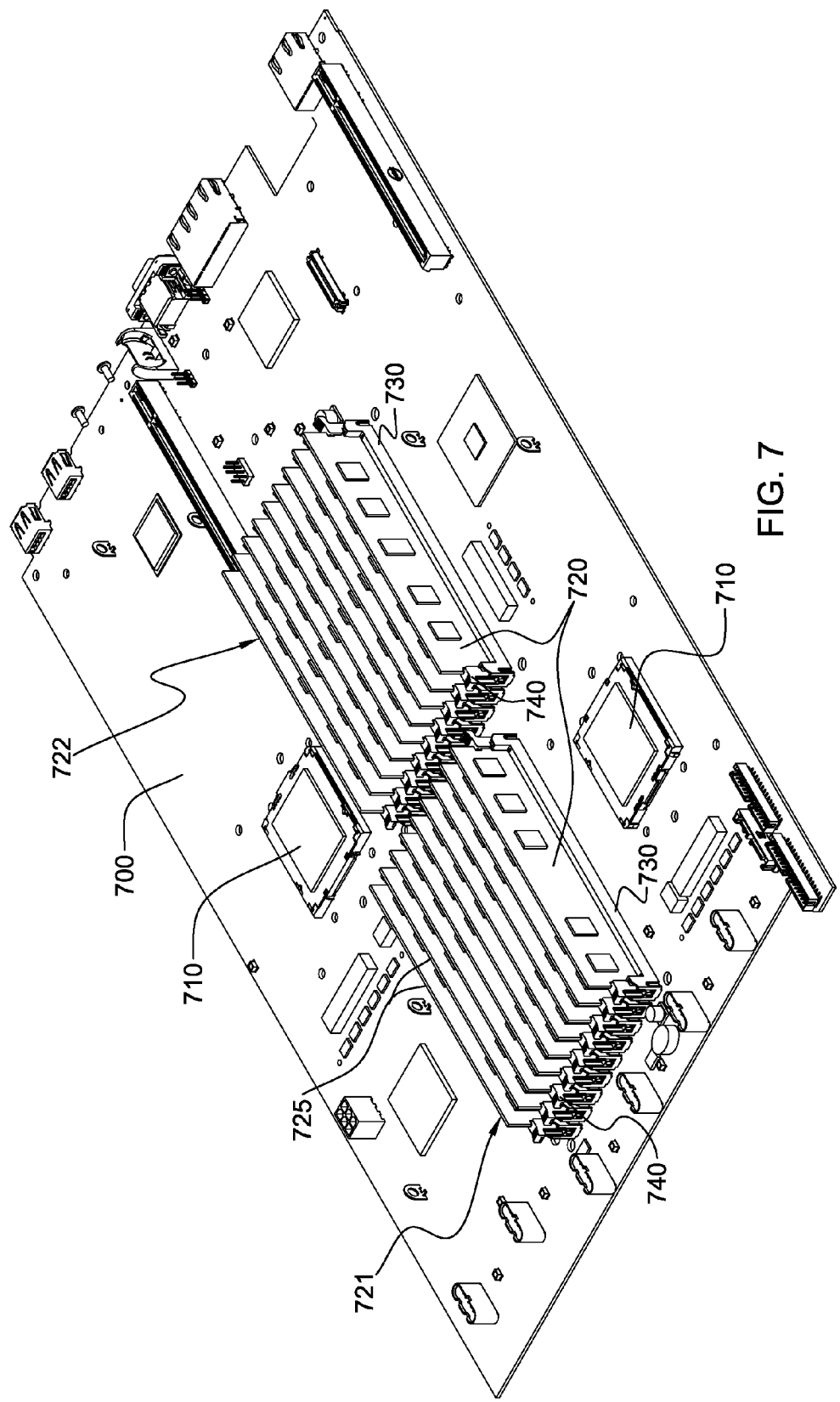
FIG. 7 depicts one detailed embodiment of a partially assembled electronic system, wherein the electronic system includes multiple different types of heat-generating electronic devices to be cooled, in accordance with one or more aspects of the present invention.

FIG. 7 depicts in greater detail one embodiment of an electronic system layout comprising a printed circuit board 700 with two processor modules 710, each of which is to have a respective liquid-cooled cold plate of a liquid-based cooling system coupled thereto, and multiple arrays 721, 722 of electronics cards 720, such as memory cards comprising memory modules on opposite first and second sides thereof. Electronics cards 720 are held in respective sockets 730, mounted to printed circuit board 700, and latches 740 at the ends of sockets 730 facilitate securing (or removing) of electronics cards 720 within (or from) the respective sockets 730. The cooling apparatus embodiments described hereinbelow advantageously facilitate liquid-cooling of electronics cards 720 without interfering with an operator's access to latches 740 at the ends of sockets 730. In addition to existing component constraints on the surface of printed circuit board 700, there is assumed to be negligible space between a cover (not shown) of the electronic system (e.g., server), and the top edge surfaces 725 of electronics cards 720.

FIGS. 8A-8D depicts a partial assembly of a cooled electronic system comprising the electronic system layout of FIG. 7, including printed circuit board 700, processor modules 710, and arrays 721, 722 of electronics cards 720. Electronics cards 720 are each shown positioned within a respective socket 730 mounted to printed circuit board 700, with latches 740 being disposed at the opposite ends of each socket 730. Latches 740 facilitate securing (or removing) electronics cards 720 within (or from) the sockets.

FIGS. 8A-8D further depict multiple liquid-cooled cold rails 800, 810, 820, shown positioned at the ends of the elongate sockets 730 of the two arrays 721, 722 of electronics cards 720. Advantageously, these liquid-cooled cold rails are configured and positioned to not interfere with opening and closing of latches 740. The multiple cold rails include a first liquid-cooled cold rail 800, disposed at one end of sockets 730 in the first array 721 of electronics cards 720, a second liquid-cooled cold rail 810 disposed between the two arrays 721, 722 of electronics cards 720, and a third liquid-cooled cold rail 820 disposed at the other end of sockets 730 of the second array 722 of electronics cards 720. Holes 830 are provided within each of the cold rails. In one embodiment, these holes may comprise threaded holes in the cold rails which facilitate attachment of the thermal spreaders (not shown) to the respective cold rails, as described further below.

Figure 8A:
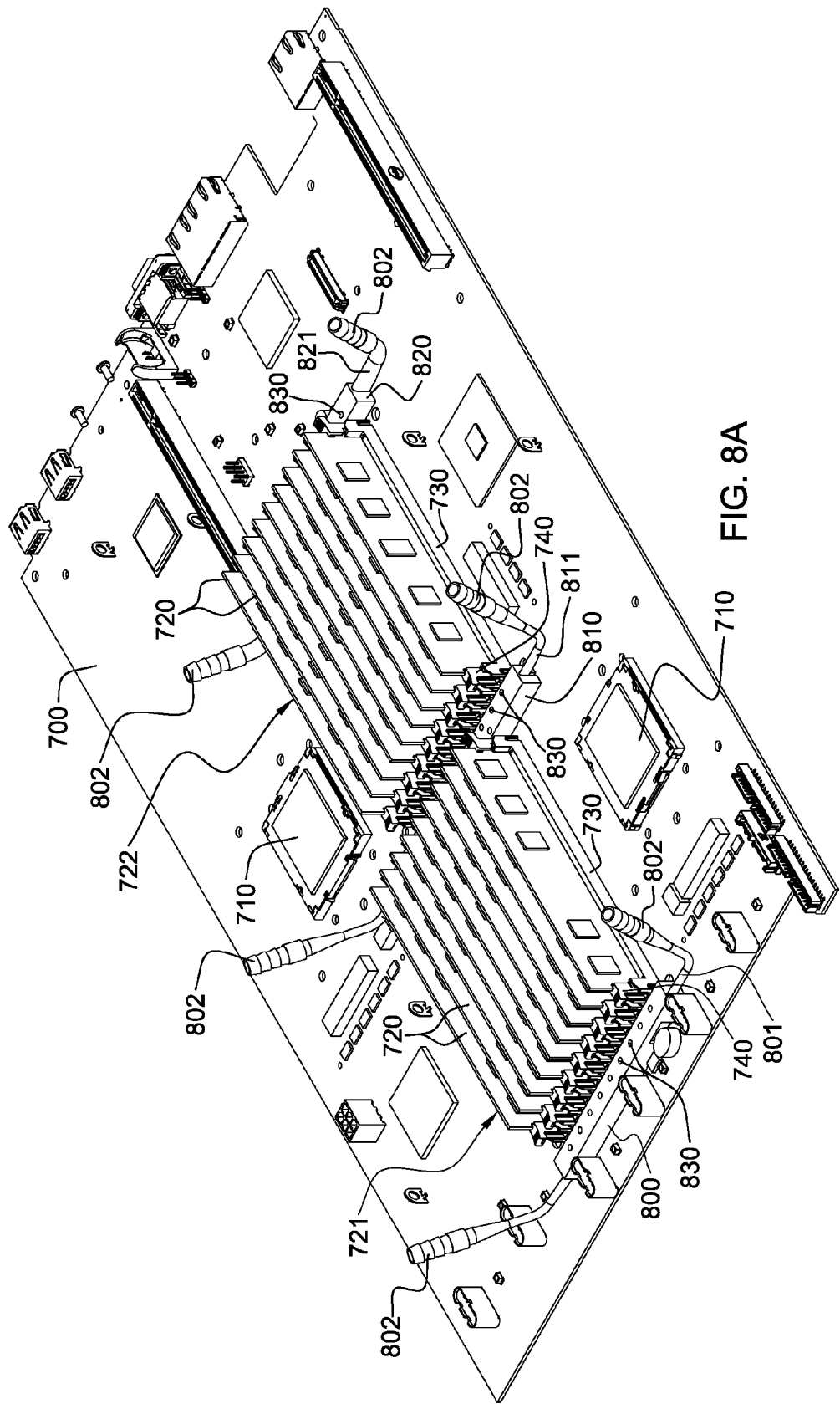
FIG. 8A depicts the electronic system of FIG. 7, with first, second and third liquid-cooled cold rails of a cooling apparatus shown in place at the ends of first and second arrays of sockets and electronics cards of the electronic system, in accordance with one or more aspects of the present invention.

In FIG. 8B, first liquid-cooled cold rail 800 is illustrated in greater detail at the one end of the sockets 730 of the first array 721 of electronics cards 720. As noted above, each cold rail is a thermally conductive structure with at least one coolant-carrying channel extending therein. In this example, the coolant-carrying channel is a flattened tube 801 that is vertically-oriented within the cold rail and offset from holes 830. As shown, first liquid-cooled cold rail 800 is sized (in this example) to fit between sockets 730, and one or more fan sockets 805. In addition, the cold rail may be selectively recessed at its bottom surface and/or one or more side surfaces to clear any interfering components, such as capacitors or chips, on the printed circuit board. The flattened tube 801 extending through the thermally conductive structure of the cold rail may comprise (as one example) a flattened ⅛ inch pipe, which may be routed above any intrusive elements on the board. In the example illustrated, quick disconnects 802 (FIG. 8A) are shown provided at the ends of flattened tube 801.

In FIG. 8C, second liquid-cooled cold rail 810 is illustrated in greater detail. This cold rail is configured and sized to fit between the two arrays 721, 722 of electronics cards. Two rows of holes 830 are provided within second liquid-cooled cold rail 810 to facilitate coupling of thermal spreaders from the different arrays to the cold rail. In order to clear the holes in the cold rail, a vertically-oriented, flattened pipe 811 passing through cold rail 810 is positioned within a slot 813 cut in the middle of the cold rail, for example, from the lower surface of the cold rail into the thermally conductive structure. By way of example, flattened tube 811 may be a flattened ⅛ inch pipe. Quick disconnect couplings 802 may also be provided for connecting flattened tube 811 in fluid communication with other coolant-carrying tubes, such as the bridging tubes described above in connection with FIG. 6.

FIG. 8D illustrates in greater detail one embodiment of third liquid-cooled cold rail 820 disposed at the other end of the second array 722 of electronics cards 720. As illustrated, third liquid-cooled cold rail 820 is positioned to not interfere with opening or closing of latches 740 at the other end of sockets 720 in the second array 722. The cold rail includes a series of holes 830, which will facilitate coupling thermal spreaders (not shown) to the cold rail, and accommodates a flattened tube 821, which is vertically aligned within an appropriately-sized slot 823 in the thermally conductive structure of the cold rail and is offset from the series of holes 830. This cold rail may again be selectively recessed at its lower surface and/or side surfaces to clear any interfering components on printed circuit board 700.

In the example of FIG. 8D, and assuming the cooling implementation depicted in FIG. 6, the tube through which water flows may be a flattened, ¼ inch pipe, routed away from any intrusive elements on the printed circuit board. As illustrated in FIG. 8A, quick disconnect couplings 802 may be provided at the ends of flattened tube 820 to facilitate coupling of the tube in fluid communication with other tubes of the liquid-based cooling approach discussed above in connection with FIG. 6. As illustrated in FIGS. 8A-8D, each liquid-cooled cold rail 800, 810, 820 may be unique in terms of its location on the circuit board, and uniquely configured due to existing constraints within the different areas of the printed circuit board. These liquid-cooled cold rails are, in one embodiment, coupled to either a cold liquid cooling loop or a warm-liquid cooling loop, depending on the cooling approach desired, as described above.

FIGS. 9A-9D depict one embodiment of a cooled electronic system comprising the electronic subassembly of FIGS. 8A-8D, with a plurality of thermal spreaders shown positioned between and in physical and thermal contact with the electronics cards of the arrays (or banks) of electronics cards. These thermal spreaders provide a thermal coupling or thermal conduction path from the electronics cards, for example, the memory modules on the opposite sides of the electronics cards, to the liquid-cooled cold rails to facilitate cooling of the electronics cards via conductive heat transfer to the cold rails, and hence to the liquid flowing through the cold rails.

In the embodiment illustrated, each thermal spreader comprises a first thermal transfer plate 910 and a second thermal transfer plate 920. The first thermal transfer plate comprises a first thermal conduction surface, and the second thermal transfer plate 920 comprises a second thermal conduction surface. The first thermal conduction surface and the second thermal conduction surface are in spaced, opposing relation, and are configured to accommodate a respective electronics card 720 therebetween, with the first conduction surface physically and thermally coupled to at least one first surface on one side of the electronics card 720, and the second thermal conduction surface physically and thermally coupled to at least one second surface on the other side of the electronics card 720. These first and second surfaces on the different sides of the electronics card may comprise, in one example, surfaces of one or more electronics devices, such as memory modules, mounted on the different sides of the respective electronics card.

Further, the first thermal transfer plate 910 and second thermal transfer plate 920 each comprise a first end edge 915, and a second end edge 916, disposed at opposite ends of the respective socket 730. Each thermal transfer plate is a thermally conductive structure formed (in one example) as an elongate, flat plate. In this example, thermally conductive extensions 912, 922 and 913, 923 are provided extending from the first and second end edges 915, 916 of each thermal transfer plate 910, 920.

Figure 9A:
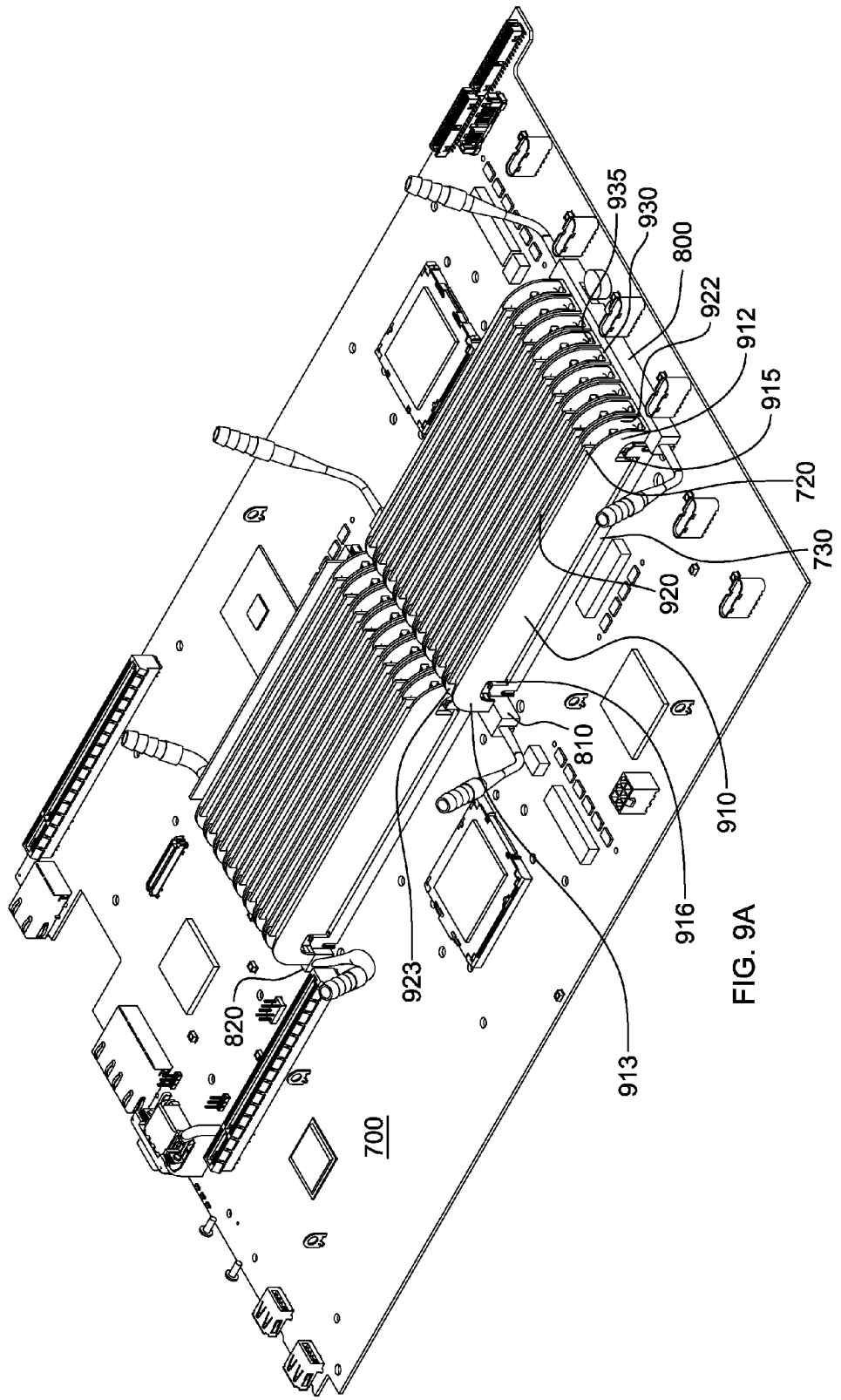
FIG. 9A depicts the partially assembled, cooled electronic system of FIGS. 8A-8D, with a plurality of thermal spreaders shown coupled to the electronics cards and thermally interfacing the electronics cards to respective liquid-cooled cold rails, in accordance with one or more aspects of the present invention.
Figure 9B:
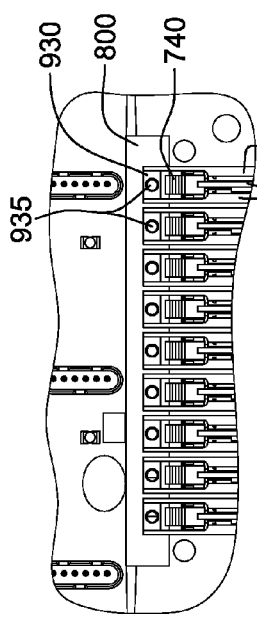
FIG. 9B is a partial depiction of the cooled electronic system of FIG. 9A, and illustrating interfacing of thermal spreaders to the first liquid-cooled cold rail at the one end of the sockets of the first array of electronics cards, in accordance with one or more aspects of the present invention.
Figure 9C:
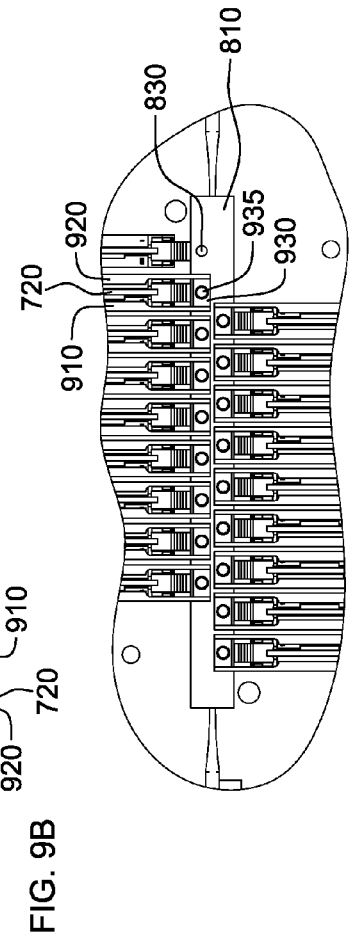
FIG. 9C is a partial depiction of the cooled electronic system of FIG. 9A, and illustrating the second liquid-cooled cold rail disposed between the first and second arrays of electronics cards, and showing interfacing of thermal spreaders coupled to the first array of electronics cards, and thermal spreaders coupled to the second array of electronics cards to the second liquid-cooled cold rail, in accordance with one or more aspects of the present invention.
Figure 9D:
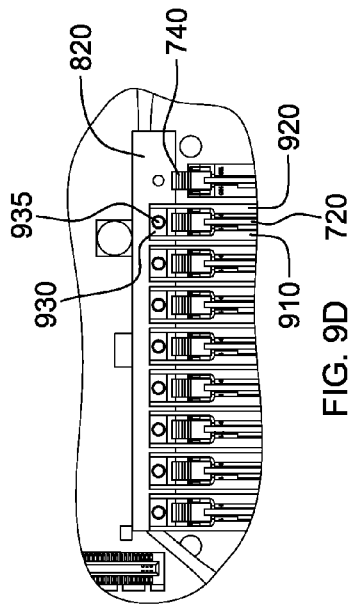
FIG. 9D is a partial depiction of the cooled electronic system of FIG. 9A, and illustrating interfacing of thermal spreaders associated with the second array of electronics cards to the third liquid-cooled cold rail of the cooled electronic system, in accordance with one or more aspects of the present invention.

In one embodiment, these extensions 912, 922 and 913, 923 are curved extensions, which may be characterized, in one embodiment, as "elephant trunk-shaped extensions". In particular, a first thermally conductive extension 912 is a curved extension which extends from and upper portion of first thermal transfer plate 910 at the first end edge thereof 915, and a similar, second thermally conductive extension 922 extends from the first end edge 915 of second thermal transfer plate 920. In addition, a third thermally conductive extension 913 extends from the second end edge 916 of first thermal transfer plate 910, and a fourth thermally conductive extension 923 extends from the second end edge 916 of second thermal transfer plate 920. The thermally conductive extensions 912, 922 at the first end edge 915 of the first and second thermal transfer plates 910, 920 are spaced apart to allow access to the respective socket latch at the end of the socket 730 containing the electronics card 720 sandwiched by the plates of the thermal spreader. Similarly, the thermally conductive extensions 913, 923 at the second end edges 916 of the first and second thermal transfer plates 910, 920 are spaced apart to allow access to the latch disposed at the other end of the socket. In this embodiment, the extensions 912, 922 and 913, 923 are joined at their ends, and connected to the respective cold rail by respective connecting flanges 930, each of which includes an opening 935, aligned to an underlying opening 830 in the adjacent cold rail 800, 810, 820. FIGS. 9B-9D illustrate these structures in greater detail, with the thermal spreaders 900 shown ready to be fastened to the respective cold rails using, for example, a threaded fastener.

As explained above, heat is transferred from the heat-generating components of the electronics card (for example, memory modules) to the conduction surfaces of the thermal transfer plates, across the thermal transfer plates to the thermally conductive extensions at the ends thereof, and from the thermally conductive extensions into the respective liquid-cooled cold rails. From the liquid-cooled cold rails, the heat is rejected to coolant flowing through the channels or tubes extending through the cold rails, and subsequently, is removed from the cooled electronic system in a manner such as, for example, explained above in connection with FIGS. 4-6.

Note that in the embodiment depicted in FIGS. 9A-9D, the connecting flanges 930 at the ends of the thermally conductive extensions (where contacting the respective cold rails), are solid connecting structures, meaning that the thermal spreaders are (in one embodiment) single-piece structures. Also, note that, in the approach depicted, heat is conducted by the thermal transfer plates to each end edge of the plates, and in particular, to the thermally conductive extensions extending from the respective end edges to the two cold rails disposed at the opposite ends of the respective sockets in an array (or bank) of electronics cards. These thermally conductive extensions and connecting flanges physically and thermally couple to the upper surface of the respective cold rails. As illustrated in the plan views of FIGS. 9B-9D, the latches for the respective sockets remain accessible by appropriately spacing each pair of thermally conductive extensions to the first and second sides of the latches at issue. This can be accomplished, in part, by reducing the thickness of the extensions compared with the thickness of the plates, as shown in the plan views of FIGS. 9B-9D.

FIGS. 10A-11C depict an alternate embodiment of a thermal spreader, which may be employed in a cooled electronic system such as depicted in FIGS. 9A-9D.

In FIGS. 10A & 10B, the cooled electronic system of FIGS. 9A-9D is again illustrated, wherein the first, second and third liquid-cooled cold rails 800, 810, 820 are shown in position, and a plurality of thermal spreaders 1000 are illustrated positioned about respective electronics cards of the electronic system. In this embodiment, the thermal spreaders are divided in half, thus comprising two separate thermal transfer plates, each configured substantially as described above in connection with the embodiment of FIGS. 9A-9D. In this embodiment, however, the thermal spreaders lack the connecting flanges at the ends of the thermally conductive extensions. Instead, two separate flanges (discussed below) extend from the respective thermally conductive extensions inwards towards the other extension. These flanges are sized and configured (in one embodiment) to mate when the thermal spreader is assembled about the respective electronics card. Aligning of the thermal transfer plates, as well as aligning of the thermal transfer plates and the electronics card, can be facilitated by providing appropriate alignment features on the plates and card. The flanges may also be curved at their ends to define an opening when positioned, as illustrated in FIGS. 10A-10B. The two halves (or two thermal transfer plates) of the thermal spreader 1000 are clipped together, with each shown positioned in physical and thermal contact with one side of the respective electronics card. In this embodiment, multiple retaining clips 1030 are illustrated. These retaining clips 1030 hold the plates of the thermal spreader in physical contact with respective sides of the electronics card during assembly of the cooled electronic system. As explained above, the thermally conductive extensions from the ends of the thermal spreader are spaced and configured to not to interfere with normal operation of the latches at the ends of the sockets within which the electronics cards are positioned. Each latch is thus accessible and facilitates securing of the electronics card within the socket or removal of the electronics card from the socket without requiring removal of the liquid-cooled cold rail, or without requiring removal of the thermal spreader.

In FIGS. 11A & 11B, one thermal transfer plate (i.e., half of the thermal spreader 1000 of FIGS. 10A & 10B) is illustrated. Referring collectively to FIGS. 11A & 11B, thermal transfer plate 1010 includes a first thermal conduction surface 1100, configured to physically and thermally couple to one or more surfaces of one or more heat-generating components on one side of the electronics card, for example, one or more memory modules disposed on one side of the electronics card. Extending from a first end edge 1101 of thermal transfer plate 1010 is a first thermally conductive extension 1110, and extending from the other end edge 1102 of thermal transfer plate 1010 is a second thermally conductive extension 1120. As noted above, in the one embodiment, these extensions are curved, for example, to avoid contact with the respective socket within which the electronics card is to be positioned.

Flanges 1103, 1104 respectively extend inwards from thermally conductive extensions 1110, 1120. In the illustrated embodiment, these flanges 1103, 1104 are curved at their ends to define half of an opening sized and configured to align to an opening in the respective liquid-cooled cold rail to which the thermally conductive extensions and flanges of the thermal spreader are to physically couple. The other half of the thermal spreader is a mirror image of thermal transfer plate 1010, such that the two thermal transfer plates have opposing first and second thermal conduction surfaces, between which the respective electronics card is sandwiched (as illustrated in FIG. 11C). The thermal transfer plates and flanges are configured with appropriate thicknesses and dimensions so that when the thermal transfer plates sandwich the electronics card, the flanges from the thermally conductive extensions at respective ends of the card meet and their curved surfaces define the openings that align with the openings in the adjacent liquid-cooled cold rail. As illustrated in this configuration, the thickness of the thermal transfer plates may be different from that of the thermally conductive extensions, for example, to facilitate providing sufficient room around the corresponding latches to allow user access and operation of the latches, without requiring disassembly of the thermal spreader.

FIG. 11C illustrates the assembled thermal spreader held in place about the electronics card via an appropriate clipping mechanism, such as spring clips 1130. As illustrated in this figure, a lower portion of the electronics card remains exposed to facilitate insertion of the electronics card within the respective socket on the printed circuit board of the electronic system. Also note that (in one embodiment), the thermal spreaders may be fabricated of a metal material, such as copper.

Figure 12A:
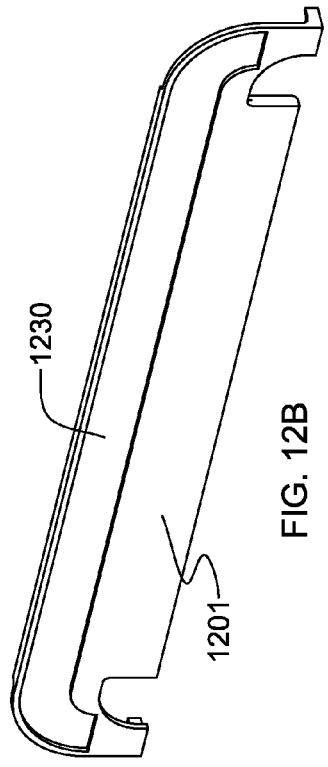
FIG. 12A depicts an alternate embodiment of a thermal transfer plate of a thermal spreader such as illustrated in FIGS. 9A-9D, and shown comprising multiple heat pipes extending within the thermal transfer plates and thermally conductive extensions at the ends thereof, in accordance with one or more aspects of the present invention.
Figure 12B:
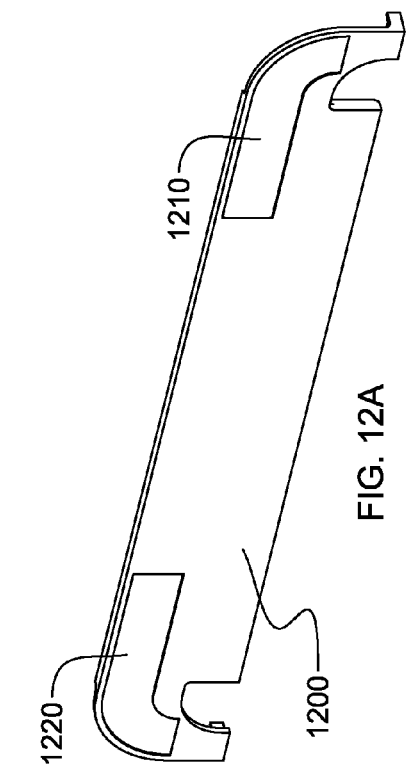
FIG. 12B depicts an alternate embodiment of the thermal transfer plate of FIG. 12A, wherein a single heat pipe extends from one thermally conductive extension at one end of the thermal transfer plate to the other thermally conductive extension at the other end of the thermal transfer plate, in accordance with one or more aspects of the present invention.
Figure 12C:
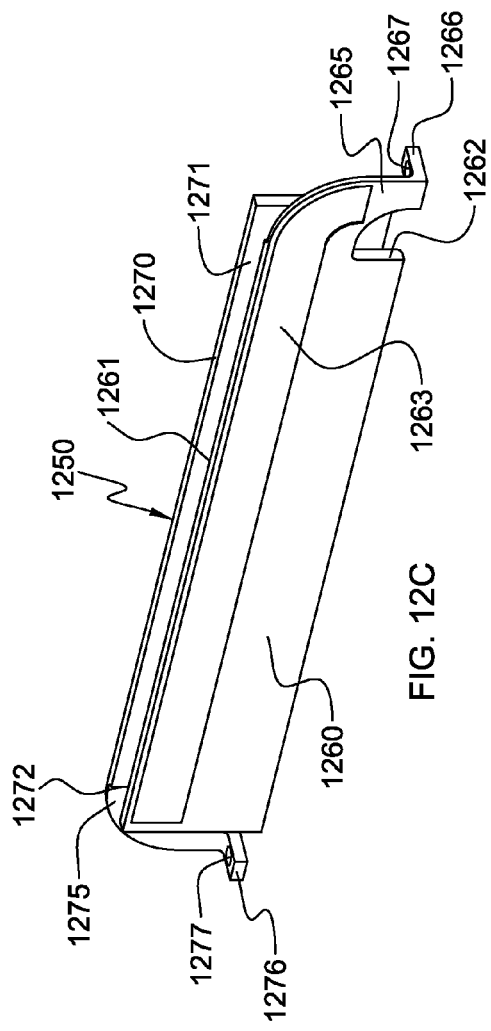
FIG. 12C depicts another embodiment of a thermal spreader comprising a first thermal transfer plate with a thermally conductive extension at one end thereof, configured for coupling to a first liquid-cooled cold rail, and a heat pipe extending through the first thermal transfer plate into the thermally conductive extension, and a second thermal transfer plate with a thermally conductive extension configured for coupling to a second liquid-cooled cold rail, in accordance with one or more aspects of the present invention.

FIGS. 12A-12C illustrate various alternate embodiments of the thermal transfer plates described above. In these alternate embodiments, one or more flat heat pipes are employed within the thermal transfer plates and the thermally conductive extensions from the transfer plates.

In FIG. 12A, a thermal transfer plate 1200 is depicted which is similar to thermal transfer plate 1010, described above in connection with FIGS. 11A-11C. However, in this embodiment, two heat pipes 1210, 1220 are provided extending from within the thermal transfer plate into respective thermally conductive extensions at the end edges thereof. In one embodiment, these heat pipes are flattened heat pipes, which are recessed into, for example, the outer facing surface of the thermal transfer plates and thermally conductive extensions. The heat pipes may be provided where needed to enhance thermal performance of the thermal spreader.

In the alternate embodiment of FIG. 12B, a single heat pipe 1230 is illustrated extending through thermal transfer plate 1201 and into thermally conductive extensions from the end edges thereof. This single heat pipe 1230 could be provided within an appropriate recess formed within the thermal transfer plate and thermally conductive extensions, for example, at the outer facing surfaces of the thermal transfer plate and extensions. Note that, in this discussion, "outer facing" refers to that surface of the thermal transfer plate facing away from the respective electronics card to be cooled, and "inner facing" refers to that surface of the thermal transfer plate facing the electronics card to be cooled.

In FIG. 12C, one embodiment of an asymmetrical thermal spreader 1250 is illustrated. In this embodiment, heat from the different sides of a single electronics card is transferred to different liquid-cooled cold rail. In particular, thermal spreader 1250 includes a first thermal transfer plate 1260 and a second thermal transfer plate 1270, which comprise a first thermal conduction surface 1261 and a second thermal conduction surface 1271 in spaced, opposing relation. These thermal conduction surfaces of the thermal transfer plates are sized and configured to accommodate a single electronics card therebetween, with the first thermal conduction surface thermally coupled to at least one first surface on one side of the electronics card, and the second thermal conduction surface thermally coupled to at least one second surface on the other side of the electronics card. As shown, a first thermally conductive extension 1265 extends from one end edge 1262 of first thermal transfer plate 1260, and a second thermally conductive extension 1275 extends from a different end edge 1272 of the second thermal transfer plate 1270. Both thermally conductive extensions 1265, 1275 are provided with flanges 1266, 1276, which extend inwards, in a direction towards the other plate. Thus (in this embodiment), the first thermal transfer plate and first thermally conductive extension conduct heat to a first liquid-cooled cold rail (not shown), and the second thermal transfer plate and second thermally conductive extension conduct heat to a different, second liquid-cooled cold rail (not shown). Securing of the thermal spreader 1250 to the two liquid-cooled cold rails is facilitated via providing openings 1267, 1277 in the respective flanges 1266, 1276 at the ends of the thermally conductive extensions.

As also shown, thermal spreader 1250 illustrated in FIG. 12C includes a heat pipe 1263 provided within, for example, at least one of the thermal transfer plates extending to the respective thermally conductive extension at the one end thereof. In one embodiment, both thermal transfer plates and their extensions could comprise a flattened heat pipe on the outer surface thereof, as illustrated in FIG. 12C.

Figure 13:
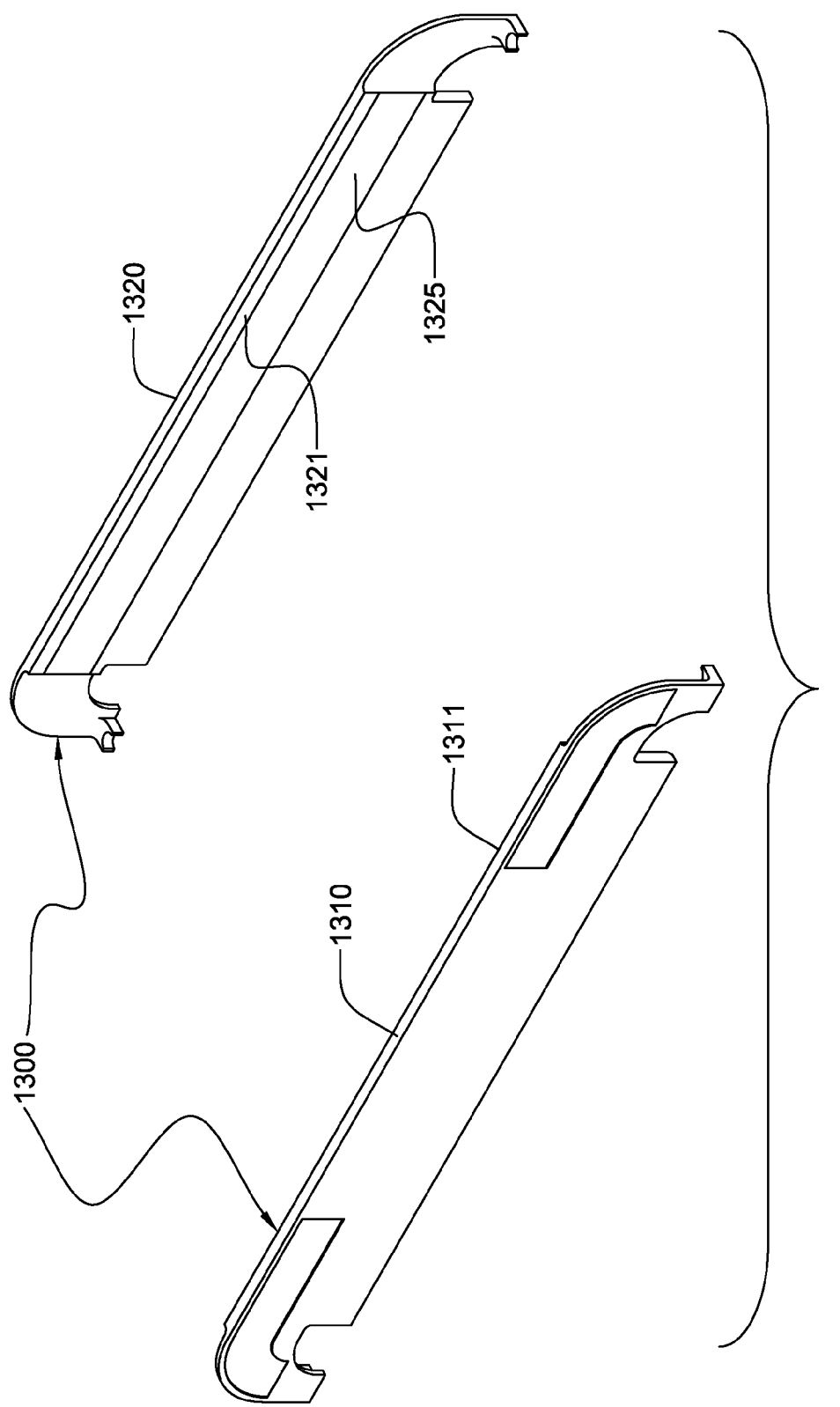
FIG. 13 depicts another embodiment of a thermal spreader for a cooled electronic system, such as illustrated in FIGS. 9A-9D, wherein multiple heat pipes are disposed at the outer-facing surfaces of the thermal transfer plates of the heat spreader, and a single, elongate heat pipe is disposed at each of the inner-facing surfaces of the thermal transfer plates of the thermal spreader, in accordance with one or more aspects of the present invention.

FIG. 13 depicts another embodiment of a thermal spreader 1300, in accordance with an aspect of the present invention. This thermal spreader 1300 is substantially identical to the thermal spreader described above in connection with FIG. 12A, with the exception that the inner facing surfaces 1311, 1321 of the thermal transfer plates 1310, 1320 may also comprise a heat pipe 1325, such as a flattened heat pipe provided within a recess within the first and second thermal conduction surfaces 1311, 1321 of the thermal transfer plates 1310, 1320.

Figure 14A:
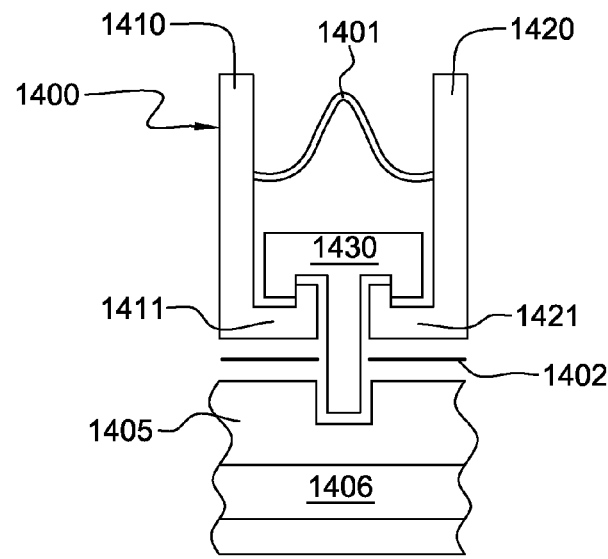
FIG. 14A depicts another embodiment of a thermal spreader, such as illustrated in FIGS. 9A-9D, and showing a coupling mechanism coupling the thermally conductive extensions of the thermal spreader to a liquid-cooled cold rail, in accordance with one or more aspects of the present invention.

FIG. 14A illustrates an alternate approach for assembling a two-part thermal spreader about an electronics card (not shown). In this embodiment, the thermal spreader 1400 includes two thermal transfer plates (such as described above) with first and second thermally conductive extensions 1410, 1420 from the end edges thereof at one side of the respective socket (not shown) mounted to the printed circuit board. In this embodiment, a spring 1401, such as a compression spring, may be provided to connect the two thermal transfer plates. The spring may be squeezed around the electronics card during installation, and the thermal transfer plates may be bolted 1430, for example, using a clamping bolt, to the cold rail 1405. Thermal interfacing of the thermally conductive extensions 1410, 1420 to the cold rail 1405 is facilitated by providing a thermal interface material 1402 between the extensions and the cold rail. As illustrated, the liquid-cooled cold rail includes one or more coolant-carrying channels 1406 extending through the cold rail. Inward-extending flanges 1411, 1421 are provided at the ends of the thermally conductive extensions 1410, 1420, where the extensions meet the cold rail. These flanges define an appropriately-sized opening to accommodate the clamping bolt (or washer) 1430, which holds the two halves of the thermal spreader securely in place about the electronics card, particularly when repeated at opposite ends of the socket to clamp the thermal spreader to two different cold rails.

Figures 14B, 14C, 14D:
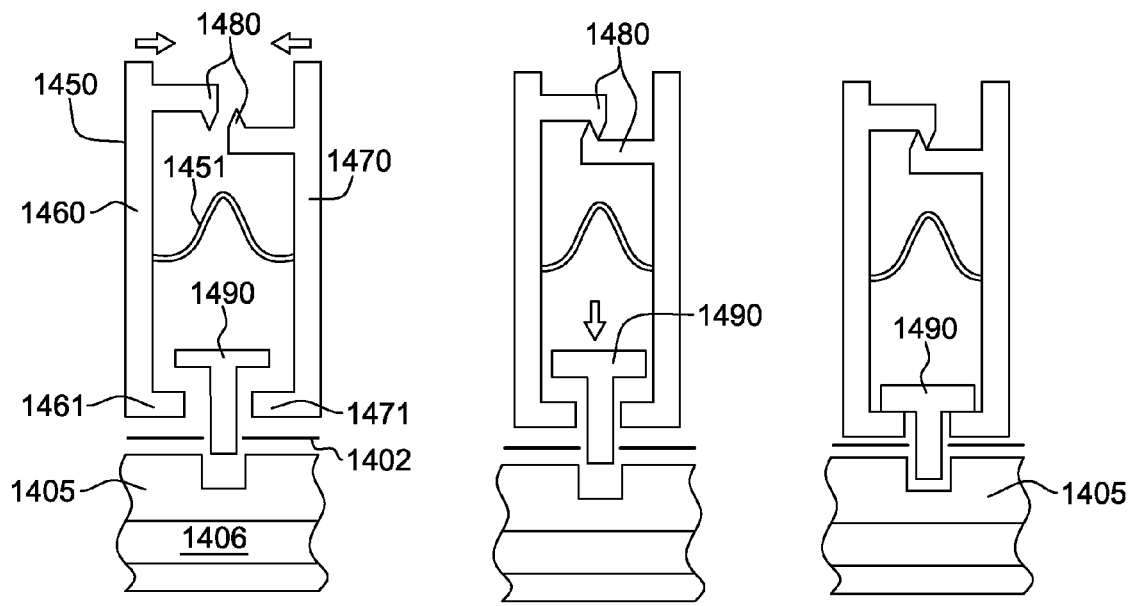
FIGS. 14B-14D depict an alternate embodiment of a thermal spreader, such as illustrated in FIGS. 9A-9D, and illustrating another coupling mechanism for coupling of the thermal spreader to a liquid-cooled cold rail, in accordance with one or more aspects of the present invention.

FIGS. 14B-14D depict an alternate embodiment for assembling a two-piece thermal spreader 1450 about an electronics card (not shown). In this embodiment, the thermal spreader 1450 includes a first thermal transfer plate and a second thermal transfer plate, each of which comprises a thermally conductive extension 1460, 1470 extending from one end edge thereof at one end of the respective socket (not shown). A spring 1451, such as a compression spring, connects the two halves of the thermal spreader together, and a clip feature 1480 is also employed in connection with the thermal transfer plates or the thermally conductive extensions to facilitate holding the two halves of the thermal spreader together around the electronics card. The thermally conductive extensions are shown bolted 1490 to the upper surface of liquid-cooled cold rail 1405, which as noted, comprises one or more liquid coolant-carrying channels 1406. Aligned openings are provided in liquid-cooled cold rail 1405 and flanges 1461, 1471 at the ends of the thermally conductive extensions 1460, 1470, respectively, contacting the upper surface of the cold rail. A thermal interface material 1402 is provided between the ends of the thermally conductive extensions and the upper surface of the cold rail to facilitate transfer of heat from the extensions into the cold rail.

In FIG. 14C, the clip feature 1480 is shown employed to secure the two halves of the thermal spreader together, and in FIG. 14D, the clamping bolt (or washer) 1490 his shown threaded into position within the aligned openings to secure the thermal spreader in place about the electronics card (not shown) and to the liquid-cooled cold rail.

Figure 15A:
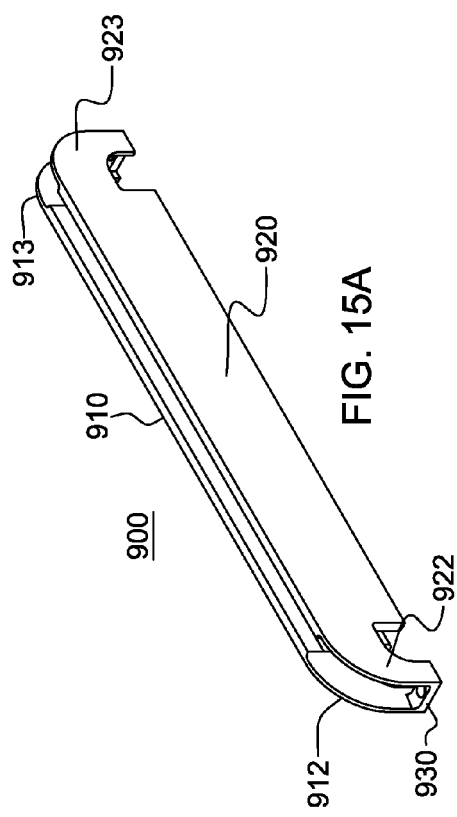
FIGS. 15A-15D illustrate one embodiment of a single-piece thermal spreader, and illustrating the single-piece thermal spreader and an electronics card being assembled prior to insertion of the electronics card into a respective socket of the electronic system, in accordance with one or more aspects of the present invention.
Figure 15B:
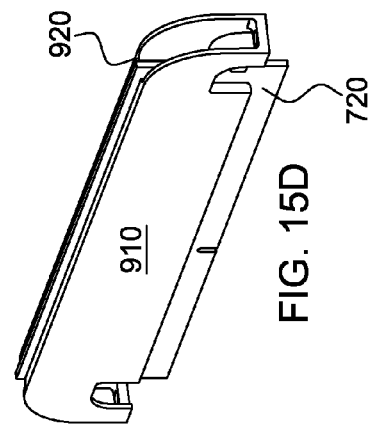
Figure 15C:
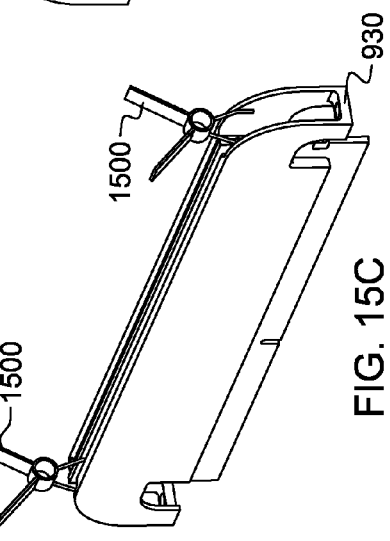
Figure 15D:
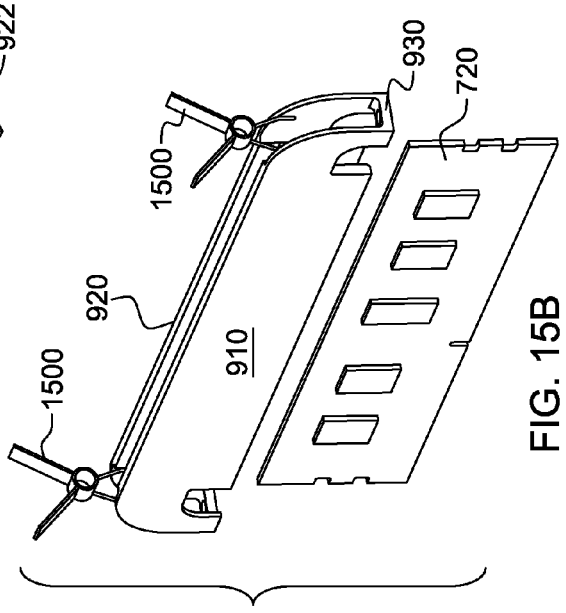

FIGS. 15A-15D further depict a one-piece thermal spreader embodiment, such as described above in connection with FIGS. 9A-9D. In this single-piece thermal spreader embodiment, connecting flanges 930 interconnect the ends of respective thermally conductive extensions 912, 922, and 913, 923, that is, where the ends couple to the liquid-cooled cold rails. With this thermal spreader configuration, the spreader and electronics card can be assembled either before the electronics card is installed into the respective socket on the printed circuit board, or after. In one embodiment, assembly of the thermal spreader and electronics card is facilitated by the use of opening clips 1500, with the connecting flanges 930 between the extensions acting as springs in compression. As illustrated in FIG. 15B, the opening clips 1500 may be employed during assembly to widen the space between the thermal transfer plates 910, 920, after which the thermal spreader is positioned about the electronics card (e.g., DIMM), as shown in FIG. 15C. Finally, opening clips 1500 may be removed (after releasing the compression spring force), and the thermal spreader's spring action results in secure, physical coupling of the thermal transfer plates of the spreader to the electronics card, thereby establishing the desired physical and thermal coupling between the inward-facing thermal conduction surfaces of the thermal transfer plates and the surfaces of the electronics card (e.g., modules on the opposite sides of the electronics card).

FIGS. 16A & 16B depict an alternate implementation for attaching thermal spreaders, such as described above in connection with FIGS. 9A-9D, to the liquid-cooled cold rails. In this embodiment, the upper surface of a liquid-cooled cold rail 1600 is provided with a plurality of posts 1610 projecting from the upper surface. These posts may comprise, in one embodiment, threaded studs, over which the openings 935 in the connecting flanges 930 of the thermal spreaders 900 are lowered. Once positioned as illustrated in FIG. 16B, a fastening mechanism, such as a nut, could be used to secure the thermal spreader to the liquid-cooled cold rail.

Figure 17B:
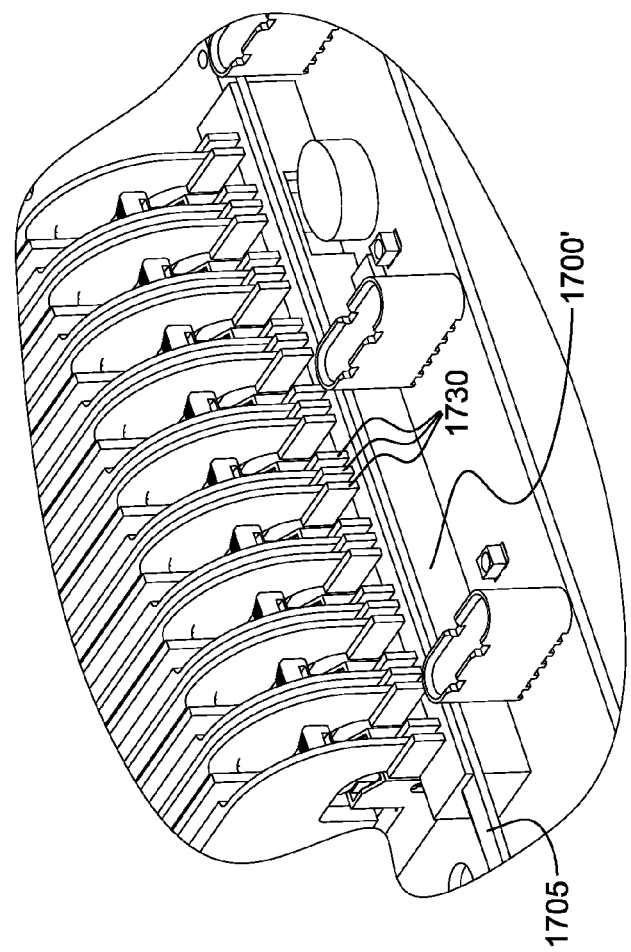
FIG. 17B depicts still another coupling embodiment for interfacing the thermal spreaders to the liquid-cooled cold rail, wherein the thermally conductive extensions extending from the thermal transfer plates reside between respective opposing fins projecting from the upper surface of the liquid-cooled cold rail, in accordance with one or more aspects of the present invention.
Figure 17A:
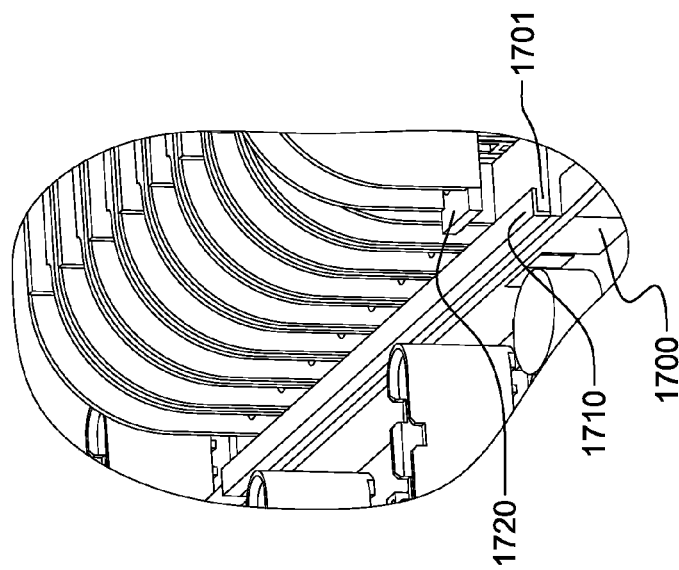
FIG. 17A illustrates another coupling embodiment for interfacing the thermal spreaders to the liquid-cooled cold rail, wherein the connecting flange between the first and second thermal transfer plates of the thermal spreader is configured to reside within a slot structure formed in association with the upper surface of the liquid-cooled cold rail, in accordance with one or more aspects of the present invention.

In FIG. 17A, a further embodiment is presented for attaching the thermal spreaders, and more particularly, the thermally conductive extensions of the thermal transfer plates to the liquid-cooled cold rail. In this embodiment, a slot structure is defined at the upper surface of the cold rail 1700 via, for example, an angled structure 1710 extending from the upper surface of the cold rail 1700 for the length of the cold rail. In addition, the connecting flanges 1720 at the ends of respective thermally conductive extensions at a common end edge of the thermal transfer plates, extend outwards from the thermally conductive extensions in a manner sized and configured for insertion of the connecting flanges within slot 1701, defined by the angled structure 1710 and the upper surface of the liquid-cooled cold rail 1700, as illustrated.

FIG. 17B depicts another alternate embodiment for attaching the thermally conductive extensions of a thermal spreader to a liquid-cooled cold rail. In this embodiment, rather than providing flanges at the ends of the thermally conductive extensions for coupling to the upper surface of the liquid-cooled cold rail, a plurality of opposing fins 1730 are provided projecting from the upper surface of the liquid-cooled cold rail. These opposing fins 1730 are spaced and configured to securely receive a respective thermally conductive extension of the thermal spreader by, for example, press-fitting the thermally conductive extension into the space defined between adjacent opposing plate fins, as illustrated in FIG. 17B. Also, note that in the embodiments of FIGS. 17A & 17B, the flattened tube extending through the liquid-cooled cold rail is disposed (by way of example) horizontally within the liquid-cooled cold rail in an upper portion of the liquid-cooled cold rail near the upper surface of the cold rail. This positioning may enhance thermal performance. Additionally, note that in the embodiments of FIGS. 17A & 17B, greater volume is available within the cold rail for locating the coolant-carrying tube(s), and thus, larger tubes may be used with higher thermal performance and lower pressure drop characteristics.

FIGS. 18A-18C depict another implementation of a thermal spreader, in accordance with an aspect of the present invention. In this implementation, the thermal spreader 1800 is one-sided, in that all of the heat conducted away from the electronics card 1801 by the spreader is removed to one liquid-cooled cold rail disposed at one end of the array of sockets containing the electronics cards. Aside from having thermally conductive extensions 1810, 1820 from only one end edge of the thermal transfer plates 1811, 1821, respectively, this configuration is similar to that described above in connection with FIGS. 11A-11C. In particular, thermal transfer plate 1811 comprises first thermally conductive extension 1810 extending from a first end edge 1815 of the thermal transfer plate, and second thermal transfer plate 1821 includes a thermally conductive extension 1820 extending from one end edge 1825 of the thermal transfer plate. These thermally conductive extensions are in spaced, opposing relation, and sized and configured to allow access to the latches 1803 at the one end of sockets 1802. As illustrated, thermal spreader 1800 comprises two halves with flanges 1812, 1822 extending from the ends of the thermally conductive extensions 1810, 1820, that are sized to mate and configured to physically and thermally couple to the upper surface 1804 of liquid-cooled cold rail 1805. The flanges 1812, 1822 are curved where meeting to define an opening 1830, which aligns with a corresponding opening in the upper surface 1804 of liquid-cooled cold rail 1805. A threaded attachment mechanism, such as a screw or bolt, is subsequently employed to securely fasten the thermal spreader to the liquid-cooled cold plate.

Figure 19C:
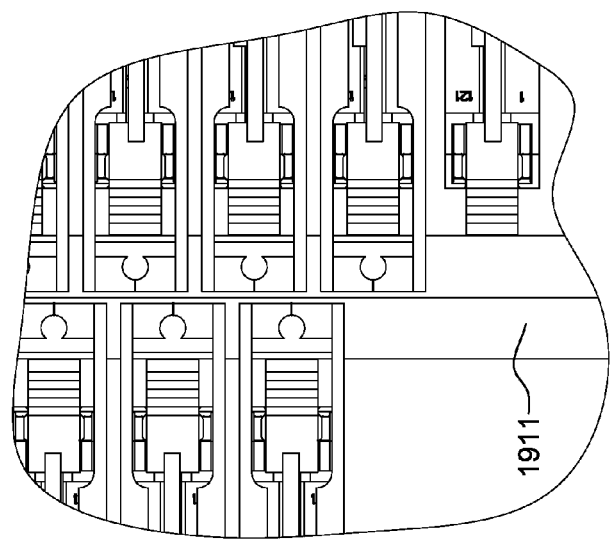
FIG. 19C is a top plan view of the partially assembled, cooled electronic system of FIG. 19B, in accordance with one or more aspects of the present invention.
Figure 19A:
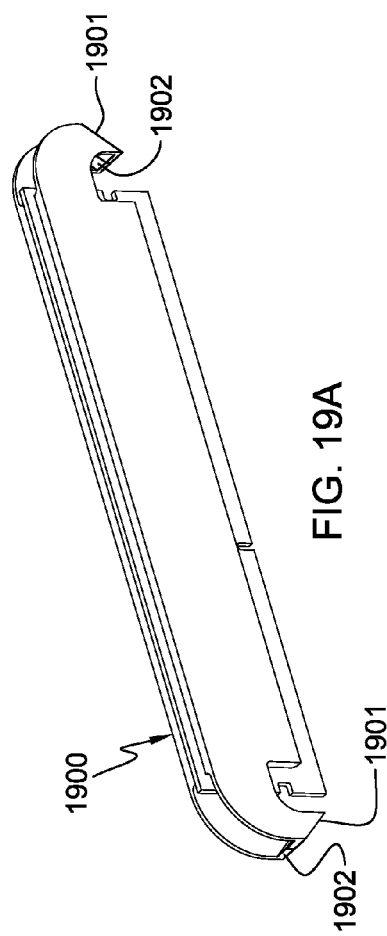
FIG. 19A depicts another embodiment of a thermal spreader, coupled to an electronics card to be inserted within a cooled electronic system, in accordance with one or more aspects of the present invention.
Figure 19B:
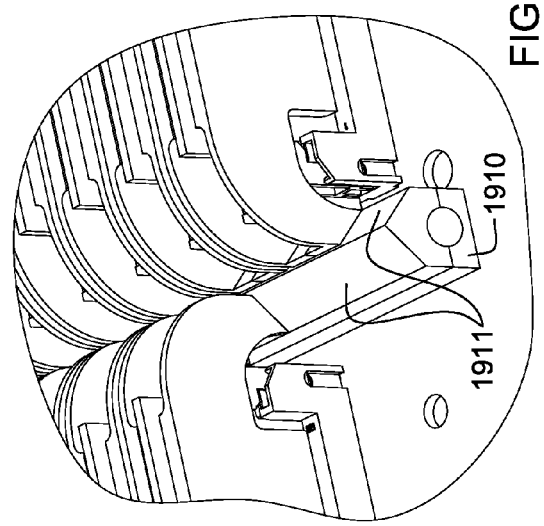
FIG. 19B is a partial depiction of a cooled electronic system, and illustrating a plurality of thermal spreaders such as depicted in FIG. 19A, coupling respective electronics cards to a liquid-cooled cold rail, wherein the liquid-cooled cold rail has an angled upper surface, in accordance with one or more aspects of the present invention.

FIGS. 19A-19C depict a further alternate embodiment of a thermal spreader and liquid-cooled cold plate, in accordance with an aspect of the present invention. In this embodiment, thermal spreader 1900 is similar to the thermal spreader described above in connection with FIGS. 11A-11C, except that the thermally conductive extensions from the end edges of the first and second thermal transfer plates are truncated and provided with a 45° angle at their ends 1901, 1902. This 45° angle facilitates mating the thermally conductive extensions to an angled upper surface of a liquid-cooled cold rail 1910, such as illustrated in FIG. 19B. In this configuration, the liquid-cooled cold rail has an upper surface with an inverted V-shape, which allows for coupling of thermal spreaders from two different arrays of electronics cards of the electronic system. The angled upper surface 1911 of liquid-cooled cold rail 1910 increases the contact area at the interface between the thermally conductive extensions from the thermal transfer plates and the upper surface of the cold rail. As in the above-described embodiments, flanges are provided at the ends of the thermally conductive extensions, which in one embodiment, define an opening aligned with a corresponding opening in the liquid-cooled cold rail, that may be employed to mechanically couple the thermal spreader to the cold rail, that is, via an appropriate attachment mechanism. As illustrated in FIG. 19C, the latches remain accessible and allow securing of the electronics card to the socket or removal of the electronics card from the socket without requiring removal of the liquid-cooled cold rail, or removal of the thermal spreader associated with the electronics card.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of fabricating a cooled electronic system, the method comprising:
providing an electronic assembly, the electronic assembly comprising:
an electronics card comprising a first surface and a second surface on opposite sides of the electronics card;
a socket with a latch at one end of the socket, the latch facilitating latching of the electronics card within or unlatching of the electronics card from the socket;
disposing a liquid-cooled structure at the one end of the socket, the liquid-cooled structure comprising a thermally conductive structure with at least one coolant-carrying channel extending within the thermally conductive structure; and
providing a thermal spreader coupling the electronics card to the liquid-cooled structure and facilitating conduction of heat from the electronics card to the liquid-cooled structure, the thermal spreader comprising:
a first thermal transfer plate and a second thermal transfer plate, the first thermal transfer plate comprising a first thermal conduction surface and the second thermal transfer plate comprising a second thermal conduction surface, the first thermal conduction surface and the second thermal conduction surface being in spaced, opposing relation and configured to accommodate the electronics card therebetween with the first thermal conduction surface coupled to the first surface of the electronics card and the second thermal conduction surface coupled to the second surface of the electronics card, and wherein the first thermal transfer plate and the second thermal transfer plate each comprises a first end edge and a second end edge;

a first thermally conductive extension extending from the first end edge of the first thermal transfer plate, and a second thermally conductive extension extending from the first end edge of the second thermal transfer plate, the first thermally conductive extension coupling the first thermal transfer plate to the liquid-cooled structure, and the second thermally conductive extension coupling the second thermal transfer plate to the liquid-cooled structure, and wherein the first thermally conductive extension is disposed at a first side of the latch at the one end of the socket of the electronic assembly, and the second thermally conductive extension is disposed at a second side of the latch, the first side and the second side of the latch being opposite sides of the latch, and wherein the latch is accessible and facilitates securing the electronics card within the socket or removal of the electronics card from the socket without removing at least one of the liquid-cooled structure or the thermal spreader;

wherein the second thermally conductive extension extends from the first end edge of the second thermal transfer plate and couples the second thermal transfer plate to the liquid-cooled structure, and wherein the second thermally conductive extension is disposed at the second side of the latch at the one end of the socket of the electronic assembly; and wherein the thermal spreader further comprises a connecting flange connecting the first thermally conductive extension and the second thermally conductive extension where physically attached to the upper surface of the liquid-cooled structure.

2. The method of claim 1, wherein at least one of the connecting flange or the upper surface of the liquid-cooled structure includes an opening facilitating securing the connecting flange to the upper surface of the liquid-cooled structure.

3. The method of claim 2, wherein the opening is disposed in the upper surface of the liquid-cooled structure, and wherein the at least one coolant-carrying channel in the liquid-cooled structure comprises a flat tube extending through the liquid-cooled structure, the flat tube being vertically oriented within the liquid-cooled structure and offset from the opening in the upper surface of the liquid-cooled structure.

4. The method of claim 3, wherein the connecting flange and the upper surface of the liquid-cooled cold rail comprise aligned openings which facilitate securing the connecting flange to the upper surface of the liquid-cooled structure.

5. The method of claim 1, wherein the liquid-cooled structure comprises an elongate slot structure disposed at the upper surface thereof, the connecting flange extending into the elongate slot structure disposed at the upper surface of the liquid-cooled structure.

6. A method of fabricating a cooled electronic system, the method comprising:
providing an electronic assembly, the electronic assembly comprising:
an electronics card comprising a first surface and a second surface on opposite sides of the electronics card;
a socket with a latch at one end of the socket, the latch facilitating latching of the electronics card within or unlatching of the electronics card from the socket;

disposing a liquid-cooled structure at the one end of the socket, the liquid-cooled structure comprising a thermally conductive structure with at least one coolant-carrying channel extending within the thermally conductive structure; and providing a thermal spreader coupling the electronics card to the liquid-cooled structure and facilitating conduction of heat from the electronics card to the liquid-cooled structure, the thermal spreader comprising:
a first thermal transfer plate and a second thermal transfer plate, the first thermal transfer plate comprising a first thermal conduction surface and the second thermal transfer plate comprising a second thermal conduction surface, the first thermal conduction surface and the second thermal conduction surface being in spaced, opposing relation and configured to accommodate the electronics card therebetween with the first thermal conduction surface coupled to the first surface of the electronics card and the second thermal conduction surface coupled to the second surface of the electronics card, and wherein the first thermal transfer plate and the second thermal transfer plate each comprises a first end edge and a second end edge;
a first thermally conductive extension extending from the first end edge of the first thermal transfer plate, and a second thermally conductive extension extending from the first end edge of the second thermal transfer plate, the first thermally conductive extension coupling the first thermal transfer plate to the liquid-cooled structure, and the second thermally conductive extension coupling the second thermal transfer plate to the liquid-cooled structure, and wherein the first thermally conductive extension is disposed at a first side of the latch at the one end of the socket of the electronic assembly, and the second thermally conductive extension is disposed at a second side of the latch, the first side and the second side of the latch being opposite sides of the latch, and wherein the latch is accessible and facilitates securing the electronics card within the socket or removal of the electronics card from the socket without removing at least one of the liquid-cooled structure or the thermal spreader;
wherein the thermal spreader further comprises a connecting flange connecting the first thermally conductive extension and the second thermally conductive extension where physically attached to the upper surface of the liquid-cooled structure;
wherein the first thermally conductive extension extending from the first thermal transfer plate and the second thermally conductive extension extending from the second thermal transfer plate each physically couple to an upper surface of the liquid-cooled structure; and
wherein the first thermally conductive extension extending from the first thermal transfer plate and the second thermally conductive extension extending from the second thermal transfer plate each comprise a flange extending from an end thereof physically coupled to the upper surface of the liquid-cooled structure, the flange extending from the first thermally conductive extension extending towards the second thermally conductive extension, and the flange extending from the second thermally conductive extension extending towards the first thermally conductive extension, and wherein the liquid-cooled structure comprises a post projecting from the upper surface of the liquid-cooled structure, the flanges extending from the first and second thermally conductive extensions at least partially encircling the post projecting from the upper surface of the liquid-cooled structure.

7. The method of claim 6, wherein the thermal spreader further comprises a compression spring coupling the first thermal transfer plate and the second thermal transfer plate together, and a clamping bolt securing the first thermally conductive extension and the second thermally conductive extension together, and securing the first thermally conductive extension and the second thermally conductive extension to the liquid-cooled structure.

8. The method of claim 7, wherein the thermal spreader further comprises a clip mechanism securing the first thermal transfer plate and the second thermal transfer plate together, and securing the first thermal transfer plate and the second thermal transfer plate in physical contact with the first surface and the second surface, respectively, of the electronics card.

9. A method of fabricating a cooled electronic system, the method comprising:
  providing an electronic assembly, the electronic assembly comprising:
    an electronics card comprising a first surface and a second surface on opposite sides of the electronics card;
    a socket with a latch at one end of the socket, the latch facilitating latching of the electronics card within or unlatching of the electronics card from the socket;
  disposing a liquid-cooled structure at the one end of the socket, the liquid-cooled structure comprising a thermally conductive structure with at least one coolant-carrying channel extending within the thermally conductive structure; and
  providing a thermal spreader coupling the electronics card to the liquid-cooled structure and facilitating conduction of heat from the electronics card to the liquid-cooled structure, the thermal spreader comprising:
    a first thermal transfer plate and a second thermal transfer plate, the first thermal transfer plate comprising a first thermal conduction surface and the second thermal transfer plate comprising a second thermal conduction surface, the first thermal conduction surface and the second thermal conduction surface being in spaced, opposing relation and configured to accommodate the electronics card therebetween with the first thermal conduction surface coupled to the first surface of the electronics card and the second thermal conduction surface coupled to the second surface of the electronics card, and wherein the first thermal transfer plate and the second thermal transfer plate each comprises a first end edge and a second end edge;
    a first thermally conductive extension extending from the first end edge of the first thermal transfer plate, and a second thermally conductive extension extending from the first end edge of the second thermal transfer plate, the first thermally conductive extension coupling the first thermal transfer plate to the liquid-cooled structure, and the second thermally conductive extension coupling the second thermal transfer plate to the liquid-cooled structure, and wherein the first thermally conductive extension is disposed at a first side of the latch at the one end of the socket of the electronic assembly, and the second thermally conductive extension is disposed at a second side of the latch, the first side and the second side of the latch being opposite sides of the latch, and wherein the latch is accessible and facilitates securing the electronics card within the socket or removal of the electronics card from the socket without removing at least one of the liquid-cooled structure or the thermal spreader;
  wherein the thermal spreader further comprises a connecting flange connecting the first thermally conductive extension and the second thermally conductive extension where physically attached to the upper surface of the liquid-cooled structure;
  wherein the first thermally conductive extension extending from the first thermal transfer plate and the second thermally conductive extension extending from the second thermal transfer plate each physically couple to an upper surface of the liquid-cooled structure; and
  wherein the first thermally conductive extension is a first curved extension extending from an upper portion of the first thermal transfer plate, and the second thermally conductive extension is a second curved extension extending from an upper portion of the second thermal transfer plate.

10. The method of claim 9, wherein the thermal spreader further comprises a first heat pipe and a second heat pipe, the first heat pipe being disposed within the first thermal transfer plate and extending into the first curved extension, and the second heat pipe being disposed within the second thermal transfer plate and extending into the second curved extension, the first heat pipe and the second heat pipe facilitating conduction of heat through the first thermal transfer plate and the second thermal transfer plate, respectively, to the liquid-cooled structure via the first curved extension and the second curved extension.

11. The method of claim 9, wherein the first thermally conductive extension and the second thermally conductive extension each physically attach to the upper surface of the liquid-cooled structure via, in part, contacting respective opposing fins of a plurality of opposing fins extending from the upper surface of the liquid-cooled structure.

* * * * *